(12) United States Patent
Haba et al.

(10) Patent No.: US 8,207,604 B2
(45) Date of Patent: Jun. 26, 2012

(54) MICROELECTRONIC PACKAGE COMPRISING OFFSET CONDUCTIVE POSTS ON COMPLIANT LAYER

(75) Inventors: Belgacem Haba, Cupertino, CA (US); Masud Beroz, Livermore, CA (US); Giles Humpston, San Jose, CA (US); Jae M. Park, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 595 days.

(21) Appl. No.: 10/985,126

(22) Filed: Nov. 10, 2004

(65) Prior Publication Data

US 2005/0181655 A1 Aug. 18, 2005

Related U.S. Application Data

(60) Provisional application No. 60/533,393, filed on Dec. 30, 2003.

(51) Int. Cl.
*H01L 23/485* (2006.01)

(52) U.S. Cl. ........... 257/690; 257/730; 257/E23.078; 257/E23.066; 257/E23.068

(58) Field of Classification Search .......... 257/737, 257/738, 780, 781, 688, 690, 691, 692, 693, 257/694, 695, 696, 697, 698, 699, 700, 729, 257/730, E23.001, E23.002, E23.01, E23.06, 257/E23.065, E23.066, E23.067, E23.068, 257/E23.069, E23.07, E23.078
See application file for complete search history.

(56) References Cited

U.S. PATENT DOCUMENTS

| 4,695,870 A | 9/1987 | Patraw |
| 4,716,049 A | 12/1987 | Patraw |
| 4,804,132 A | 2/1989 | Difrancesco |
| 4,902,600 A | 2/1990 | Tamagawa et al. |
| 4,924,353 A | 5/1990 | Patraw |
| 4,975,079 A | 12/1990 | Beaman et al. |
| 4,982,265 A | 1/1991 | Watanabe et al. |
| 5,068,714 A | 11/1991 | Seipler |

(Continued)

FOREIGN PATENT DOCUMENTS

EP 1602749 12/2005

(Continued)

OTHER PUBLICATIONS

North Corporation, "Processed Intra-layer Interconnection Material for PWBs [Etched Copper Bump with Copper Foil]," NMBI™, Version 2001.6.

(Continued)

*Primary Examiner* — Samuel Gebremariam
*Assistant Examiner* — Andrew O. Arena
(74) *Attorney, Agent, or Firm* — Lerner, David, Littenberg, Krumholz & Mentlik, LLP

(57) ABSTRACT

A microelectronic package includes a mounting structure, a microelectronic element associated with the mounting structure, and a plurality of conductive posts physically connected to the mounting structure and electrically connected to the microelectronic element. The conductive posts project from the mounting structure in an upward direction, at least one of the conductive posts being an offset post. Each offset post has a base connected to the mounting structure, the base of each offset post defining a centroid. Each offset post also defines an upper extremity having a centroid, the centroid of the upper extremity being offset from the centroid of the base in a horizontal offset direction transverse to the upward direction. The mounting structure is adapted to permit tilting of each offset post about a horizontal axis so that the upper extremities may wipe across a contact pad of an opposing circuit board.

20 Claims, 18 Drawing Sheets

U.S. PATENT DOCUMENTS

| | | |
|---|---|---|
| 5,083,697 A | 1/1992 | Difrancesco |
| 5,138,438 A | 8/1992 | Masayuki et al. |
| 5,148,265 A | 9/1992 | Khandros et al. |
| 5,148,266 A | 9/1992 | Khandros et al. |
| 5,189,505 A | 2/1993 | Bartelink |
| 5,196,726 A | 3/1993 | Nishiguchi et al. |
| 5,214,308 A | 5/1993 | Nishiguchi et al. |
| 5,397,997 A | 3/1995 | Tuckerman et al. |
| 5,409,865 A | 4/1995 | Karnezos |
| 5,455,390 A | 10/1995 | DiStefano et al. |
| 5,518,964 A | 5/1996 | DiStefano et al. |
| 5,615,824 A | 4/1997 | Fjelstad et al. |
| 5,656,550 A | 8/1997 | Tsuji et al. |
| 5,659,952 A | 8/1997 | Kovac et al. |
| 5,679,977 A | 10/1997 | Khandros et al. |
| 5,731,709 A | 3/1998 | Pastore et al. |
| 5,798,286 A | 8/1998 | Faraci et al. |
| 5,802,699 A | 9/1998 | Fjelstad et al. |
| 5,811,982 A | 9/1998 | Beaman et al. |
| 5,854,507 A | 12/1998 | Miremadi et al. |
| 5,973,391 A | 10/1999 | Bischoff et al. |
| 5,980,270 A | 11/1999 | Fjelstad et al. |
| 6,001,671 A | 12/1999 | Fjelstad |
| 6,032,359 A | 3/2000 | Carroll |
| 6,052,287 A | 4/2000 | Palmer et al. |
| 6,054,756 A | 4/2000 | DiStefano et al. |
| 6,059,984 A | 5/2000 | Cohen et al. |
| 6,175,159 B1 | 1/2001 | Sasaki et al. |
| 6,177,636 B1 | 1/2001 | Fjelstad |
| 6,202,297 B1 | 3/2001 | Faraci et al. |
| 6,217,972 B1 | 4/2001 | Beroz et al. |
| 6,258,625 B1 | 7/2001 | Brofman et al. |
| 6,307,260 B1 | 10/2001 | Smith et al. |
| 6,332,270 B2 | 12/2001 | Beaman et al. |
| 6,358,627 B2 | 3/2002 | Benenati et al. |
| 6,362,525 B1 | 3/2002 | Rahim |
| 6,458,411 B1 | 10/2002 | Goossen et al. |
| 6,495,914 B1 | 12/2002 | Sekine et al. |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,545,228 B2 | 4/2003 | Hashimoto |
| 6,550,666 B2 | 4/2003 | Chew et al. |
| 6,555,918 B2 | 4/2003 | Masuda et al. |
| 6,560,117 B2 | 5/2003 | Moon |
| 6,578,754 B1 | 6/2003 | Tung |
| 6,589,870 B1 | 7/2003 | Katoh et al. |
| 6,624,653 B1 | 9/2003 | Cram |
| 6,647,310 B1 | 11/2003 | Yi et al. |
| 6,681,982 B2 | 1/2004 | Tung |
| 6,767,819 B2 | 7/2004 | Lutz |
| 6,782,610 B1 | 8/2004 | Iijima et al. |
| 6,870,274 B2 | 3/2005 | Huang et al. |
| 6,902,869 B2 | 6/2005 | Appelt et al. |
| 2002/0056906 A1 | 5/2002 | Kajiwara et al. |
| 2002/0125571 A1 | 9/2002 | Corisis et al. |
| 2002/0153602 A1 | 10/2002 | Tay et al. |
| 2003/0107118 A1 | 6/2003 | Pflughaupt et al. |
| 2003/0132518 A1 | 7/2003 | Castro |
| 2003/0164540 A1 | 9/2003 | Lee et al. |
| 2004/0031972 A1 | 2/2004 | Pflughaupt et al. |
| 2004/0245213 A1 | 12/2004 | Fukase et al. |
| 2005/0097727 A1 | 5/2005 | Iijima et al. |
| 2005/0101136 A1 | 5/2005 | Mori |
| 2005/0116326 A1 | 6/2005 | Haba et al. |
| 2005/0124091 A1 | 6/2005 | Fukase et al. |
| 2005/0285246 A1 | 12/2005 | Haba et al. |
| 2007/0017090 A1 | 1/2007 | Sakai et al. |

FOREIGN PATENT DOCUMENTS

| | | |
|---|---|---|
| JP | 62-68015 A | 9/1994 |
| JP | 2002-313996 A | 10/2002 |

OTHER PUBLICATIONS

Neo-Manhattan Technology, A Novel HDI Manufacturing Process, "High-Density Interconnects for Advanced Flex Substrates & 3-D Package Stacking," IPC Flex & Chips Symposium, Tempe, AZ, Feb. 11-12, 2003.

International Search Report, PCT/US2008/03473.

Office Action from Japanese Application No. 2007-518347 dated Feb. 1, 2011.

MICROELECTRONIC PACKAGE COMPRISING OFFSET CONDUCTIVE POSTS ON COMPLIANT LAYER

CROSS REFERENCE TO RELATED APPLICATIONS

The present application claims the benefit of the filing date of U.S. Provisional Application No. 60/533,393 filed Dec. 30, 2003, the disclosure of which is hereby incorporated herein by reference.

FIELD OF THE INVENTION

The present invention generally relates to microelectronic packages and more specifically to methods of making and testing microelectronic packages.

BACKGROUND OF THE INVENTION

Microelectronic devices such as semiconductor chips typically require many input and output connections to other electronic components. The input and output contacts of a semiconductor chip or other comparable device are generally disposed in grid-like patterns that substantially cover a surface of the device (commonly referred to as an "area array") or in elongated rows which may extend parallel to and adjacent each edge of the device's front surface, or in the center of the front surface. Typically, devices such as chips must be physically mounted on a substrate such as a printed circuit board, and, the contacts of the device must be electrically connected to electrically conductive features of the circuit board.

Semiconductor chips are commonly provided in packages, which facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls, typically about 0.1 mm to about 0.8 mm (5 and 30 mils) in diameter, attached to the terminals of the package. A package having an array of solder balls projecting from its bottom surface is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This is advantageous in that it reduces the overall size of the assembly and permits the use of short interconnections between various devices on the substrate, which in turn limits signal propagation time between devices and thus facilitates operation of the assembly at high speeds.

Assemblies including packages can suffer from stresses imposed by differential thermal expansion and contraction of the device and the substrate. During operation, as well as during manufacture, a semiconductor chip tends to expand and contract by an amount different from the amount of expansion and contraction of a circuit board. Where the terminals of the package are fixed relative to the chip or other device, such as by using solder, these effects tend to cause the terminals to move relative to the contact pads on the circuit board. This can impose stresses in the solder that connects the terminals to the contact pads on the circuit board. As disclosed in certain preferred embodiments of U.S. Pat. Nos. 5,679,977; 5,148,266; 5,148,265; 5,455,390; and 5,518,964, the disclosures of which are hereby incorporated by reference herein, semiconductor chip packages can have terminals that are movable with respect to the chip or other device incorporated in the package. Such movement can compensate to an appreciable degree for differential expansion and contraction.

Testing of packaged devices poses another formidable problem. In some manufacturing processes, it is necessary to make temporary connections between the terminals of the packaged device and a test fixture, and operate the device through these connections to assure that the device is fully functional. Ordinarily, these temporary connections must be made without bonding the terminals of the package to the test fixture. It is important to assure that all of the terminals are reliably connected to the conductive elements of the test fixture. However, it is difficult to make connections by pressing the package against a simple test fixture such as an ordinary circuit board having planar contact pads. If the terminals of the package are not coplanar, or if the conductive elements of the test fixture are not coplanar, some of the terminals will not contact their respective contact pads on the test fixture. For example, in a BGA package, differences in the diameter of the solder balls attached to the terminals, and non-planarity of the chip carrier, may cause some of the solder balls to lie at different heights.

These problems can be alleviated through the use of specially constructed test fixtures having features arranged to compensate for non-planarity. However, such features add to the cost of the test fixture and, in some cases, introduce some unreliability into the test fixture itself. This is particularly undesirable because the test fixture, and the engagement of the device with the test fixture, should be more reliable than the packaged devices themselves in order to provide a meaningful test. Moreover, devices intended for high-frequency operation typically must be tested by applying high frequency signals. This requirement imposes constraints on the electrical characteristics of the signal paths in the test fixture, which further complicates construction of the test fixture.

Additionally, when testing the packaged devices having solder balls connected with terminals, solder tends to accumulate on those parts of the test fixture which engage the solder balls. This accumulation of solder residue can shorten the life of the test fixture and impair its reliability.

A variety of solutions have been put forth to deal with the aforementioned problems. Certain packages disclosed in the aforementioned patents have terminals which can move with respect to the microelectronic device. Such movement can compensate to some degree for non-planarity of the terminals during testing.

U.S. Pat. Nos. 5,196,726 and 5,214,308, both issued to *Nishiguchi* et al., disclose a BGA-type approach in which bump leads on the face of the chip are received in cup-like sockets on the substrate and bonded therein by a low-melting point material. U.S. Pat. No. 4,975,079 issued to Beaman et al. discloses a test socket for chips in which dome-shaped contacts on the test substrate are disposed within conical guides. The chip is forced against the substrate so that the solder balls enter the conical guides and engage the dome-shaped pins on the substrate. Sufficient force is applied so that the dome-shaped pins actually deform the solder balls of the chip.

A further example of a BGA socket may be found in commonly assigned U.S. Pat. No. 5,802,699, issued Sep. 8, 1998, the disclosure of which is hereby incorporated by reference herein. The '699 patent discloses a sheet-like connector having a plurality of holes. Each hole is provided with at least one resilient laminar contact extending inwardly over a hole. The bump leads of a BGA device are advanced into the holes so that the bump leads are engaged with the contacts. The assembly can be tested, and if found acceptable, the bump leads can be permanently bonded to the contacts.

Commonly assigned U.S. Pat. No. 6,202,297, issued Mar. 20, 2001, the disclosure of which is hereby incorporated by reference herein, discloses a connector for microelectronic devices having bump leads and methods for fabricating and using the connector. In one embodiment of the '297 patent, a dielectric substrate has a plurality of posts extending upwardly from a front surface. The posts may be arranged in an array of post groups, with each post group defining a gap therebetween. A generally laminar contact extends from the top of each post. In order to test a device, the bump leads of the device are each inserted within a respective gap thereby engaging the contacts which wipe against the bump lead as it continues to be inserted. Typically, distal portions of the contacts deflect downwardly toward the substrate and outwardly away from the center of the gap as the bump lead is inserted into a gap.

Commonly assigned U.S. Pat. No. 6,177,636, the disclosure of which is hereby incorporated by reference herein, discloses a method and apparatus for providing interconnections between a microelectronic device and a supporting substrate. In one preferred embodiment of the '636 patent, a method of fabricating an interconnection component for a microelectronic device includes providing a flexible chip carrier having first and second surfaces and coupling a conductive sheet to the first surface of the chip carrier. The conductive sheet is then selectively etched to produce a plurality of substantially rigid posts. A compliant layer is provided on the second surface of the support structure and a microelectronic device such as a semiconductor chip is engaged with the compliant layer so that the compliant layer lies between the microelectronic device and the chip carrier, and leaving the posts projecting from the exposed surface of the chip carrier. The posts are electrically connected to the microelectronic device. The posts form projecting package terminals which can be engaged in a socket or solder-bonded to features of a substrate as, for example, a circuit panel. Because the posts are movable with respect to the microelectronic device, such a package substantially accommodates thermal coefficient of expansion mismatches between the device and a supporting substrate when the device is in use. Moreover, the tips of the posts can be coplanar or nearly coplanar.

Despite all of the above-described advances in the art, there remains a need for microelectronic packages having terminals that can accommodate test boards having non-planar contact pads. There also remains a need for microelectronic packages that are able to form reliable electrical interconnections with a circuit board during testing and burn-in of the package. Thus, still further improvements in making and testing microelectronic packages would be desirable.

SUMMARY OF THE INVENTION

One aspect of the present invention, a provides a microelectronic package which includes a mounting structure, a microelectronic element associated with the mounting structure, and a plurality of conductive posts physically connected to the mounting structure and electrically connected to the microelectronic element. The conductive posts desirably project from the mounting structure in an upward direction. At least one of the conductive posts may be an offset post. Each offset post preferably has a base connected to the mounting structure, the base of each offset post defining a centroid. As further explained below, where the base has a regular, biaxially symmetrical or point symmetrical shape such as a circle, the centroid is simply the geometric center of the base. Each offset post also desirably defines an upper extremity having a centroid, the centroid of the upper extremity being offset from the centroid of the base in a horizontal offset direction transverse to the upward direction. When the package according to this aspect of the invention is engaged with an external unit such as a test fixture, vertically-directed contact forces are applied by the contact pads of the external unit. The contact forces applied to each offset post are centered at the centroid of the upper extremity. The reaction forces applied by the mounting structure to the base of the post are centered at the centroid of the base. Because these centroids are offset from one another, the forces applied to the post tend to tilt it about a horizontal axis. Tilting of the post causes the upper extremity of the post to wipe across the surface of the contact pad, which promotes good contact between the post and the contact pad. The mounting structure desirably is deformable, so that the bases of the posts can move relative to the microelectronic element in the tilting mode discussed above. The mounting structure also may be arranged to deform so as to permit translational movement of the posts in a vertical direction, toward the microelectronic element. The movement of individual posts may differ, so that the tips of numerous posts can be engaged with numerous contact pads even where the tips of the posts are not coplanar with one another, the contact pads are not coplanar with one another, or both, prior to engagement of the posts and contact pads.

In certain embodiments, each offset post may have a tip end defining a plane transverse to the upward direction. In other embodiments, each offset post may comprise a first body including the base of the offset post and a second body formed atop the first body, the second body including the extremity of the offset post. The offset posts may have sharp features at or adjacent their upper extremities.

The mounting structure may include a flexible substrate, which may have conductive traces formed thereon for electrically interconnecting the posts with a microelectronic element. The flexible substrate may be a generally sheetlike substrate extending substantially in a horizontal plane, the substrate having a top surface and a bottom surface, the conductive posts projecting upwardly from the top surface. The flexible substrate may also include a plurality of gaps extending through the substrate and defining a plurality of regions, different ones of the posts being disposed on different ones of the regions such as disclosed in commonly assigned U.S. Provisional Application Ser. No. 60/533,437, entitled "MICRO PIN GRID WITH PIN MOTION ISOLATION," filed on Dec. 30, 2003, the disclosure of which is hereby incorporated herein by reference. The package may incorporate a support layer such as a compliant layer disposed between the flexible substrate and the microelectronic element. In other embodiments, the package may include a plurality of support elements spaced apart from one another and disposed between the flexible substrate and the microelectronic element, the bases of the posts being spaced horizontally from the support elements as described in greater detail in the co-pending, commonly assigned United States Provisional Application No. 60/533,210 entitled "MICROELECTRONIC PACKAGES AND METHODS THEREFOR," filed on Dec. 30, 2003, the disclosure of which is hereby incorporated herein by reference.

The microelectronic element of the package preferably has faces and contacts, the contacts being electrically interconnected with the conductive posts. In certain embodiments, the contacts are exposed at a first face of the microelectronic element and the mounting structure overlies the first face. In other embodiments, the contacts are exposed at a first face of the microelectronic element and the mounting structure overlies a second, oppositely-directed face of the microelectronic element.

A further aspect of the invention includes methods of processing packages such as those discussed above. In such methods, the package is tested by advancing the microelectronic package toward a substrate such as a test fixture having contact pads. The package is advanced until the upper extremities of one or more posts engage the contact pads of the substrate. During engagement, at least one of the offset posts preferably tilts about a horizontal axis. As described above, the tilting of the posts provides a wiping action of the post tips on opposing contact pads of a test board. The conductive posts may then be maintained in contact with the contact pads of the substrate during testing the package. After the testing step, the package may be disengaged from the contact pads, and the conductive posts of the microelectronic package may be bonded to electrically conductive elements of a circuit panel.

Another aspect of the present invention provides a microelectronic package which includes a mounting structure, a microelectronic element associated with the mounting structure, and a plurality of conductive terminals carried on the mounting structure. Each of the conductive terminals desirably has an exposed contact surface. The terminals, the mounting structure or both are plastically deformable by the contact forces applied upon engagement of the terminals with an external unit such as a test fixture. Thus, the exposed contact surfaces can be displaced relative to the microelectronic element. In certain embodiments, at least some of the conductive terminals are plastically deformable posts having tips defining at least some of the contact surfaces, the plastically deformable posts being plastically deformable so that the tips can be displaced relative to the bases of the posts. In other embodiments, the mounting structure includes a plastically deformable support structure. As further explained below, the plastically deformable elements of the package in certain preferred embodiments allow the contact surfaces of the terminals to move through an appreciable range of motion, greater than that which could be achieved using elements of comparable size operating entirely in the elastic mode during engagement with the test substrate. Preferred embodiments according to this aspect of the invention thus provide a package with the ability to compensate for substantial nonplanarity of the terminals, of the test fixture, or both.

A related aspect of the invention provides further methods of processing a microelectronic package. In such a method, the microelectronic package may be processed by engaging the exposed conductive terminals of the microelectronic package with an external element such as a test fixture so as to plastically deform at least one element of the package so as to bring the conductive terminals into electrical contact with the test fixture. The package may then be tested while the conductive terminals are engaged with the test fixture. After testing the conductive terminals may be disengaged from the test fixture, and bonded to contact pads of a circuit panel. The package may be heated during assembly or testing.

In yet another aspect of the invention, of the present invention, a microelectronic package includes a microelectronic element, and a plurality of electrically conductive posts projecting upwardly away from the microelectronic element, whereby each post has an upper extremity remote from the microelectronic element. At least some of the posts are preferably multi-element posts, each multi-element post including plurality of tip elements defining the upper extremity of the posts. The tip elements are desirably adapted to deform upon engagement with a contact pad so that the tip elements move away from one another and wipe across an opposing contact pad.

A still further aspect of the invention provides methods of making microelectronic packages and elements of such packages. A method according to this aspect of the invention desirably includes providing a blank made of a conductive material such as copper, applying a fluid under pressure, desirably a liquid, to the blank to form at least one conductive terminal in the blank, and providing electrical interconnections to the at least one conductive terminal. The at least one conductive terminal may be a conductive post. The method may also include heating the blank so as to make the blank more ductile during the forming operation.

In preferred embodiments, the blank is placed atop a mold having one or more depressions formed therein and the blank is secured over the one or more depressions of the mold. Fluid pressure is desirably applied to using a pressure chamber engaged with the blank so as to force portions of the blank into the depressions. In other embodiments, the fluid pressure is applied by directing a fluid stream against a face of the blank. Terminal formation using fluid pressure facilitates the formation of conductive terminals having complex shapes. Such complex conductive terminals may also be produced in large volumes and at low cost.

The methods according to this aspect of the invention may further include providing electrical interconnections to the at least one conductive terminal, desirably by removing portions of the blank, such as by using an etching process, to form at least one conductive trace connected with the at least one conductive terminal. The at least one conductive terminal may comprise a plurality of conductive terminals and the at least one conductive trace may comprise a plurality of conductive traces, with each conductive trace interconnected with one of the conductive terminals. At least one of the conductive traces may be electrically interconnected with a microelectronic element, such as a semiconductor chip.

The method of making a microelectronic package may also include providing a mounting structure such as a dielectric substrate so that the at least one conductive terminal and the at least one trace are physically connected to the dielectric substrate. The dielectric substrate may be united with the blank either before, during or after portions of the blank are removed to form the at least one conductive trace.

These and other preferred embodiments of the present invention will be described in more detail below.

DETAILED DESCRIPTION

Figure 1:
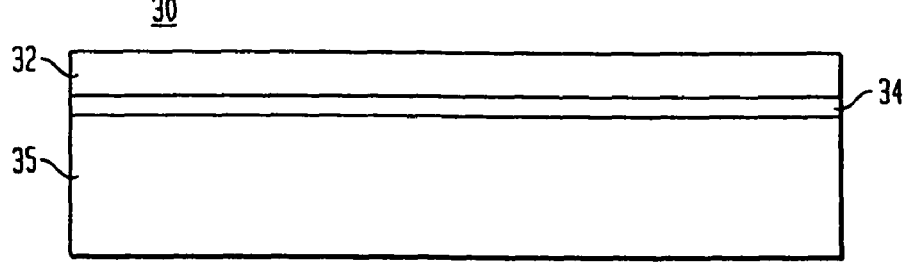
FIG. 1 shows a front elevational view of a metallic plate used for making a microelectronic subassembly, in accordance with certain preferred embodiments of the present invention.
Figure 2A:
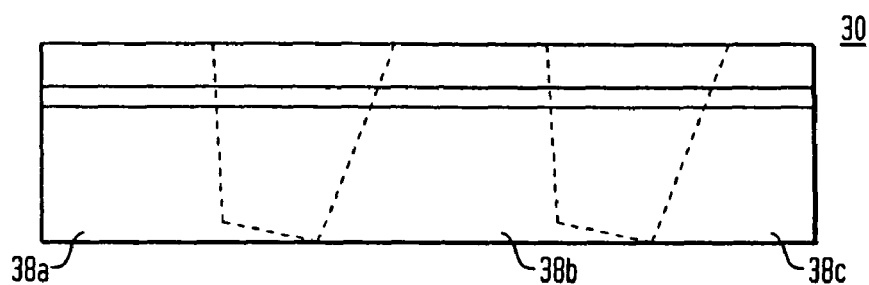
FIGS. 2A-2E show a method of making a microelectronic subassembly, in accordance with certain preferred embodiments of the present invention.
Figure 2B:
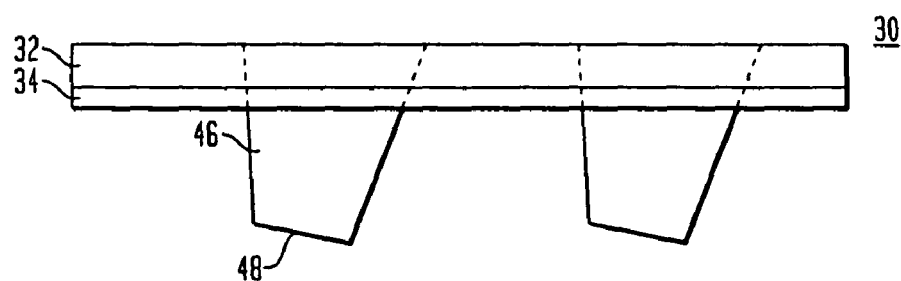
Figure 2C:
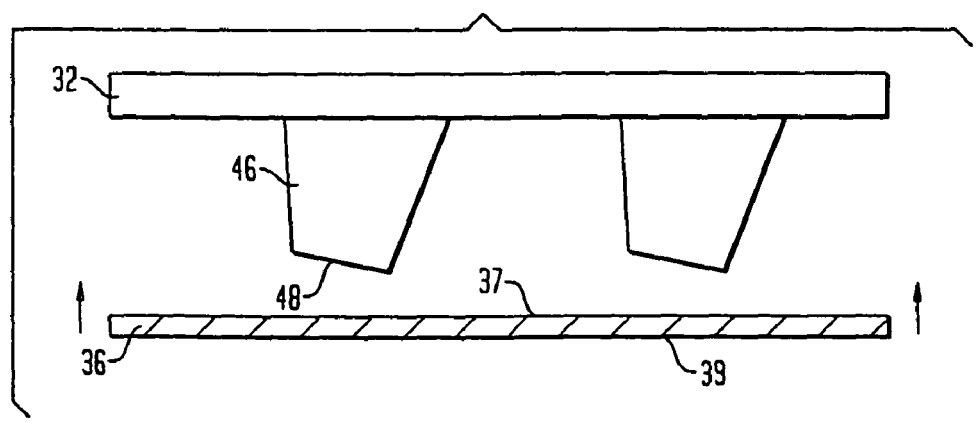
Figure 2D:
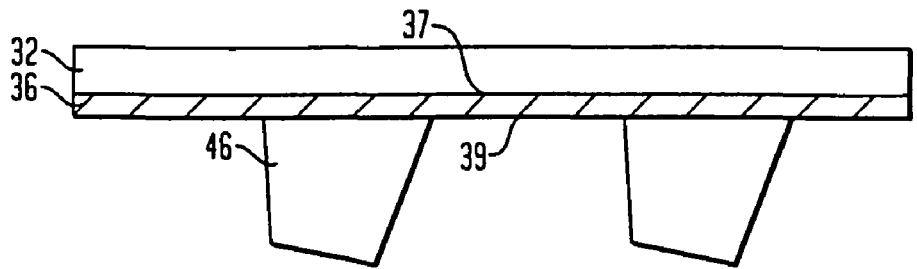
Figure 2E:
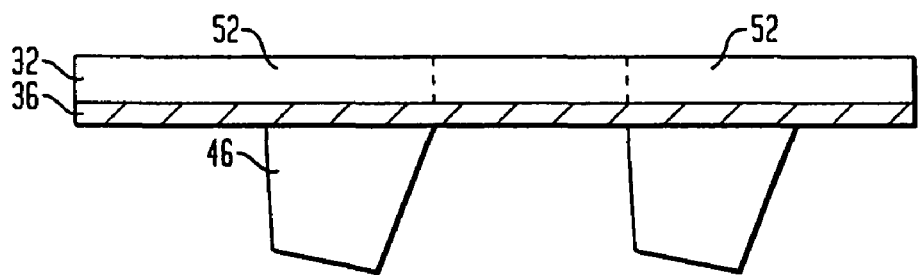

Referring to FIG. 1, in certain preferred embodiments of the present invention, a microelectronic subassembly may be fabricated by a process such as that disclosed in co-pending, commonly assigned U.S. Provisional Application No. 60/508,970, the disclosure of which is incorporated by reference herein. As disclosed in certain preferred embodiments of the '970 application, a metallic plate 30 includes a top layer 32 made of a conductive material, an intermediate etch stop layer 34 and a bottom layer 35 made of a conductive material. The top and bottom layers 32, 35 may include electrically conductive materials such as copper. The intermediate etch stop layer 34 may include materials such as nickel. Referring to FIGS. 2A and 2B, the bottom layer 35 of metallic plate 30 is stamped or etched to remove portions 38a, 38b and 38c of bottom layer 35 so as to form conductive terminals or posts 46. Referring to FIGS. 2B and 2C, after the posts 46 have been formed, the etch stop layer 34 is removed by a process that leaves the top layer 32 and the posts 46 in place. One preferred method for removing the etch stop layer includes a chemical etching process. Referring to FIGS. 2C and 2D, a flexible dielectric sheet 36 such as a polyimide film is assembled with the top layer 32 and the posts 46 so that the posts 46 project through the dielectric layer 36. A first face 37 of the dielectric sheet 36 faces toward the top layer 32 and a second face 39 of the dielectric layer faces toward contact surfaces 48 of the conductive terminals 46. The dielectric layer may be fabricated by coating a dielectric layer such as a polyimide onto the top layer 32 and around the terminals, or more typically, by forcibly engaging the terminals with the dielectric sheet so that the terminals penetrate through the sheet. Although the thickness of the dielectric substrate will vary with the application, the dielectric substrate most typically is about 15-100 μm thick. Referring to FIG. 2E, once the dielectric sheet is in place, the top layer is etched to form individual conductive traces 52 on the first face 37 of the dielectric layer 36.

In the particular embodiment illustrated in FIGS. 2A-2E, the flexible dielectric substrate 36 is assembled with top layer 32 before the top layer is treated. However, in other embodiments, the flexible dielectric substrate 36 may be attached to the top layer 30 after the conductive traces have been formed or at a later process step. Alternatively, conventional processes such as plating may form the traces. An etching process may also be used, whereby the terminals or posts may be formed using the methods disclosed in commonly assigned U.S. Pat. No. 6,177,636, the disclosure of which is hereby incorporated by reference herein. In yet other preferred embodiments, the conductive terminals may be fabricated as individual elements and assembled to the flexible dielectric sheet in any suitable manner that connects the conductive terminals to the traces. As used herein, the terminology "conductive terminal" may also mean a conductive bump, or a conductive post having a height significantly greater than its width.

Figure 3:
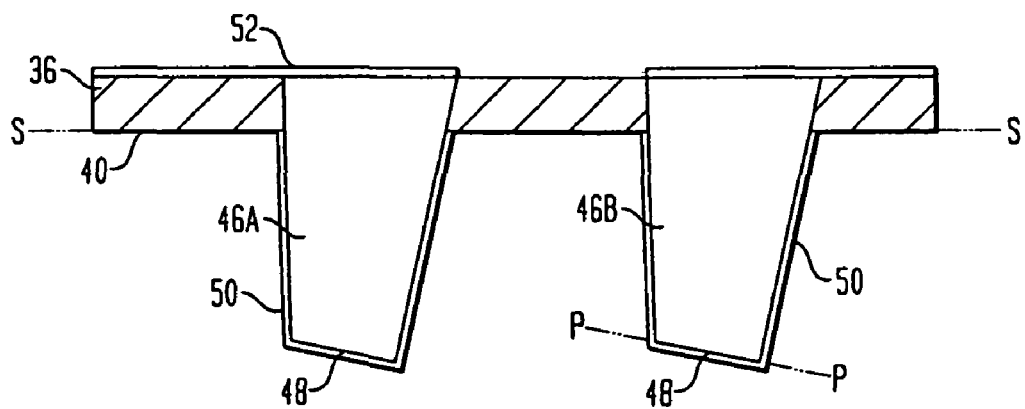
FIG. 3 shows a front elevational view of the subassembly of FIG. 2E.

Referring to FIG. 3, each conductive terminal 46 has an exposed contact surface 48 that defines a plane P which is transverse to a plane S defined by bottom surface 40 of flexible substrate 36. A highly conductive metal layer 50 such as gold may be formed over an outer surface of the conductive terminals 46.

Figure 4A:
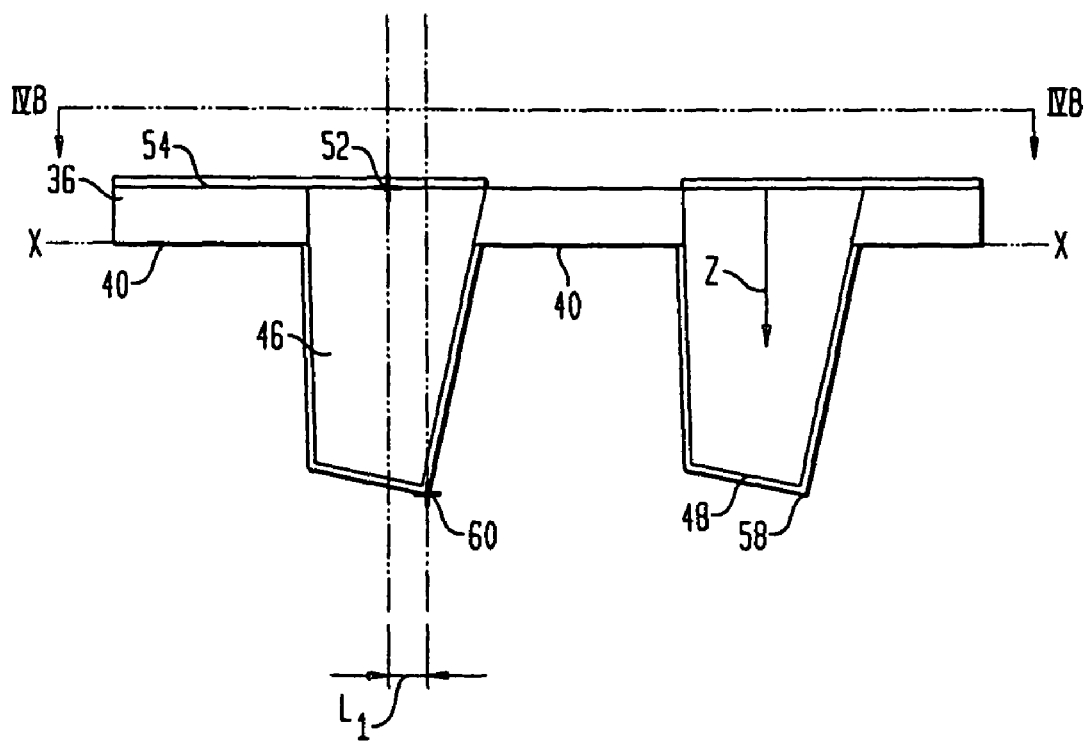
FIG. 4A shows another view of the subassembly shown in FIG. 3.
Figure 4B:
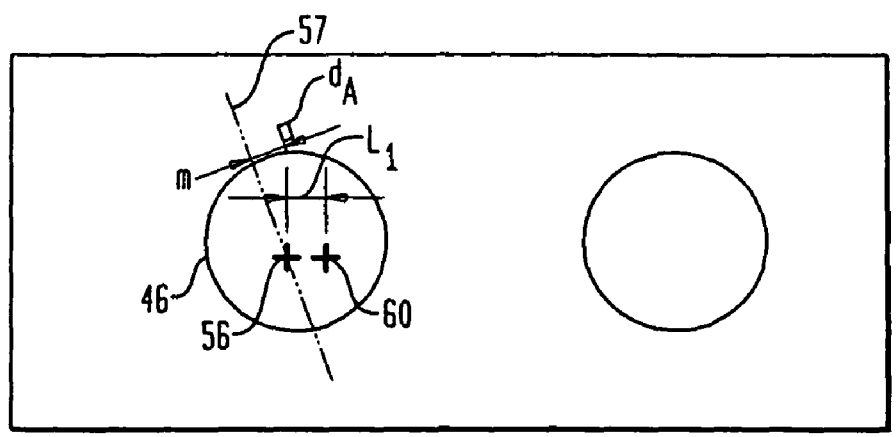
FIG. 4B shows a top plan view of the subassembly in FIG. 4A

Referring to FIGS. 4A and 4B, each conductive post 46 is physically connected to flexible substrate 36 and projects from the flexible substrate in an upward direction designated Z (pointing toward the bottom of the drawing in FIG. 4A). In a particular preferred embodiment shown in FIG. 4A, the upward direction Z preferably extends in a direction substantially perpendicular to plane X defined by the bottom surface 40 of flexible substrate 36. The base 54 of conductive post 46 defines a centroid 56. The centroid is defined such that for any arbitrary line 57 drawn through the centroid, the integral of the product of the distance or moment arm from the line to an incremental area element dA, taken over the area of the base lying on one side of the line is equal to the corresponding integral taken on the opposite side of the line. The conductive post 46 also has an upper extremity 58 which is the region of exposed contact surface 48 that lies furthest away in the upward direction Z from the base of conductive post 46. The upper extremity 58 defines a centroid 60 that is offset from the centroid 56 of the base 54 in a horizontal offset direction transverse to the upward direction Z. Desirably, there is a sharp edge bounding contact surface 48, particularly at upper extremity 58. As shown in FIGS. 4A and 4B, the centroid 60 of extremity 58 is offset a horizontal distance $L_1$ from the centroid 56 of the base 54.

Figure 5A:
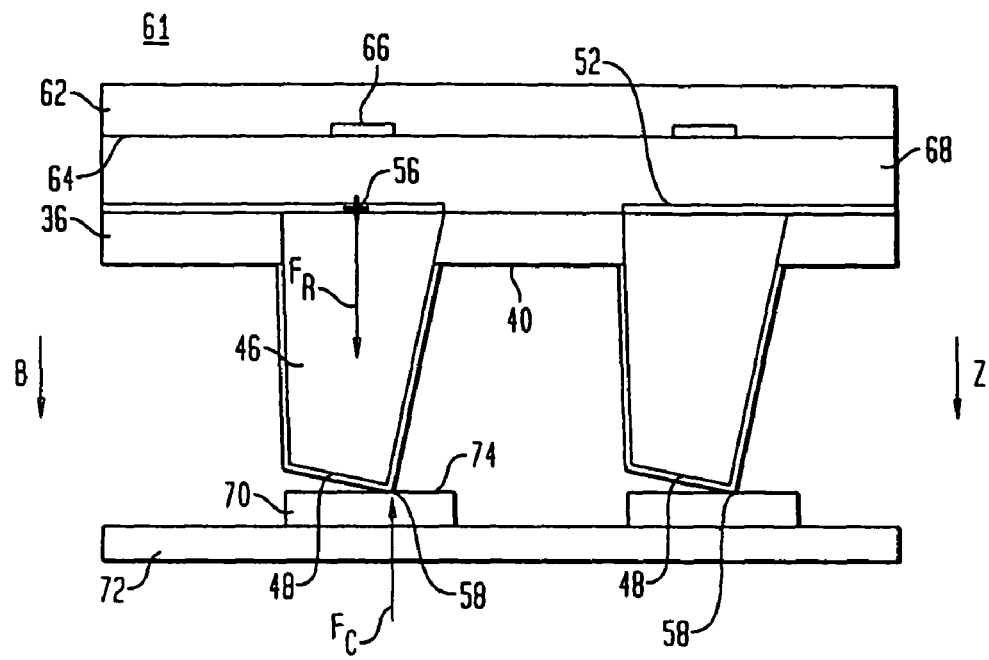
FIG. 5A shows a front elevational view of a microelectronic package, in accordance with certain preferred embodiments of the present invention.

Referring to FIG. 5A, the flexible dielectric substrate 36 and the conductive posts 46 mounted thereon are assembled with a microelectronic element 62 such as a semiconductor chip having a front or contact-bearing face 64 and electrical contacts 66 exposed at face 64. A passivation layer (not shown) may be formed over the contact-bearing face 64 with openings at contacts 66. The assembly also includes a support layer 68 such as a compliant layer which may be made of an elastomer, a gel on a stiffer material such as an epoxy or other adhesive. One or more of traces 52 are preferably electrically interconnected with one or more of the contacts 66 of semiconductor chip 62 for electrically interconnecting the posts 46 with the microelectronic element 62.

Figure 5B:
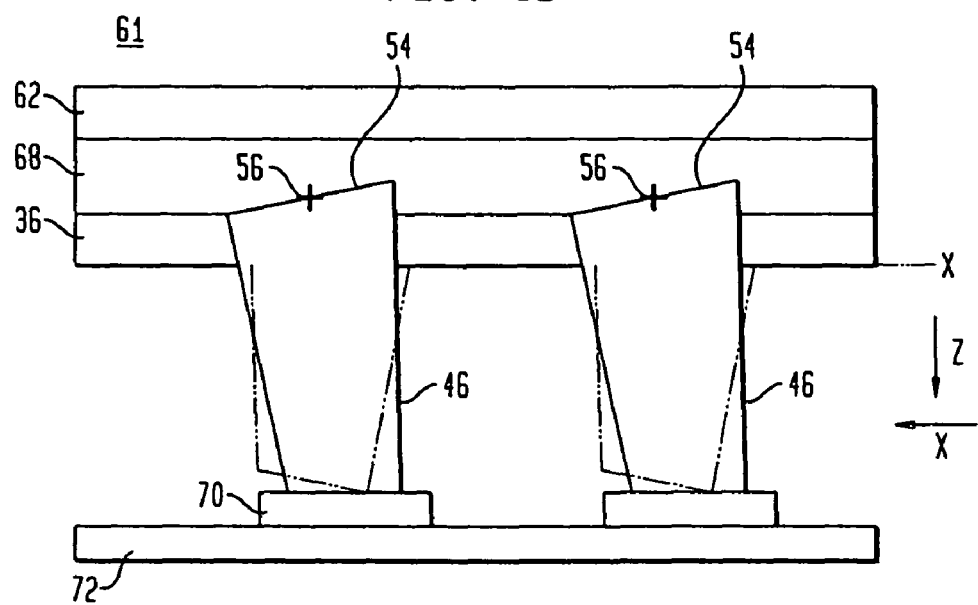
FIG. 5B shows the microelectronic package of FIG. 5A being connected to a circuit board, in accordance with certain preferred embodiments of the present invention.

Referring to FIGS. 5A and 5B, in a method of operation according to one embodiment of the present invention, the microelectronic package 61 is tested by juxtaposing the conductive bumps 46 with contact pads 70 on a second microelectronic element 72 such as a circuitized test board. The conductive bumps 46 are placed in substantial alignment with top surfaces 74 of the respective contact pads 70. As the conductive bumps are advanced toward the contact 70 with a compression of motion in the direction Z, the upper extremity 58 of each contact surface is the first portion of contact surface 48 to engage top surface 74 of contact 70. The vertical force $F_C$ applied by the contact pad 70 on the conductive post 46 is centered at the centroid of the upper extremity 58. This contrary force $F_C$ causes the base 54 of the conductive post 46 to move into the compliant layer 68. The vertical compression of the reaction force $F_R$ is centered at the centroid 51 of the base. The horizontal offset between these forces applies a torque or moment tending to tilt the post about a horizontal axis. As shown in FIG. 5B, the conductive post 46 tilts about the horizontal axis so that there is rotation of the conductive post about the horizontal axis. This causes the tips of the posts to move horizontally across contacts 70, to provide a wiping action. Optionally, the microelectronic package may also be moved horizontally in the direction X to provide further wiping action. The wiping action promotes metal-to-metal contact between contact surface 48 of conductive post 46 and top surface 74 of contact pad 70.

Figure 5C:
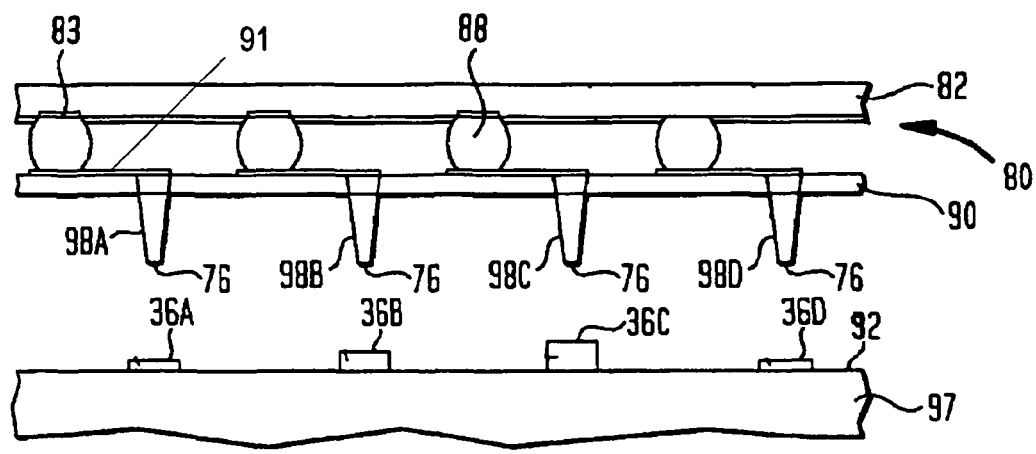
FIG. 5C is an elevational view illustrating a package according to a variation of the embodiment illustrated in FIGS. 5A-B.

In a variation of the embodiment illustrated in FIGS. 5A-B, a microelectronic package 80 is shown in FIG. 5C (reproduced from FIG. 3 of U.S. Pat. No. 7,176,043 and which matured from U.S. Provisional Application Ser. No. 60/533, 210, incorporated by reference herein). The microelectronic package 80 utilizes support elements 88, such as solder balls, to separate the microelectronic element 82 from the flexible layer 90. Conductive posts 98A-D extend from the flexible layer 90 and are connected to the support elements 83 via conductive traces 91 extending therebetween. The support elements 83 are therefore horizontally offset from the conductive posts 98A-D. The tips 76 of the conductive posts 98A-D of the microelectronic package 80 can be joined with a second microelectronic element or device 97, such as a circuit board having contacts 36A-D exposed at a top surface 92.

The conductive posts disclosed herein (such as conductive posts 46 of FIGS. 2A-2E and 5A-5B) can be used in the embodiment shown in FIG. 5C, wherein a support element 88 is horizontally offset from the conductive posts.

Figure 6A:
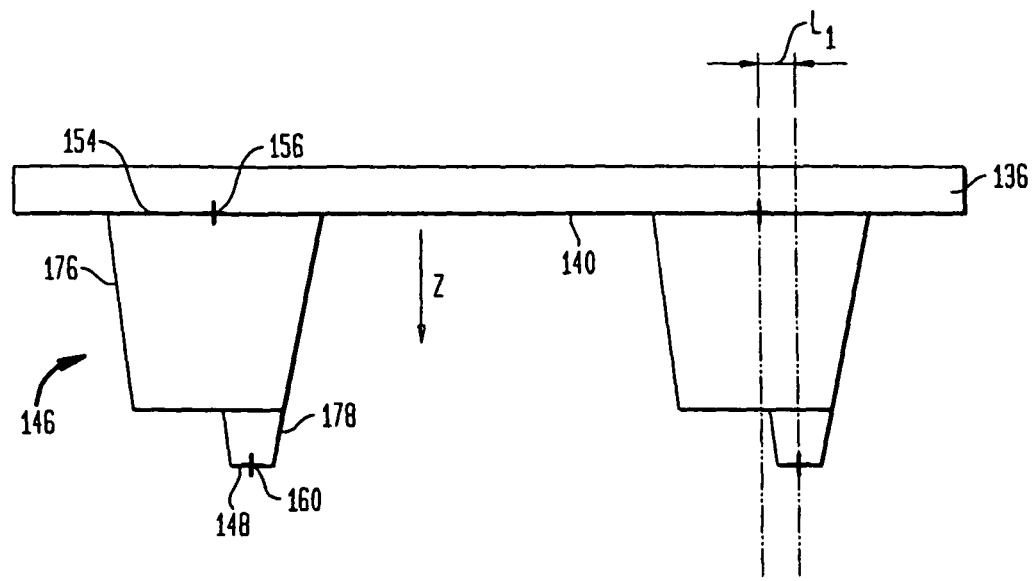
FIGS. 6A and 6B show a microelectronic package, in accordance with other preferred embodiments of the present invention.
Figure 6B:
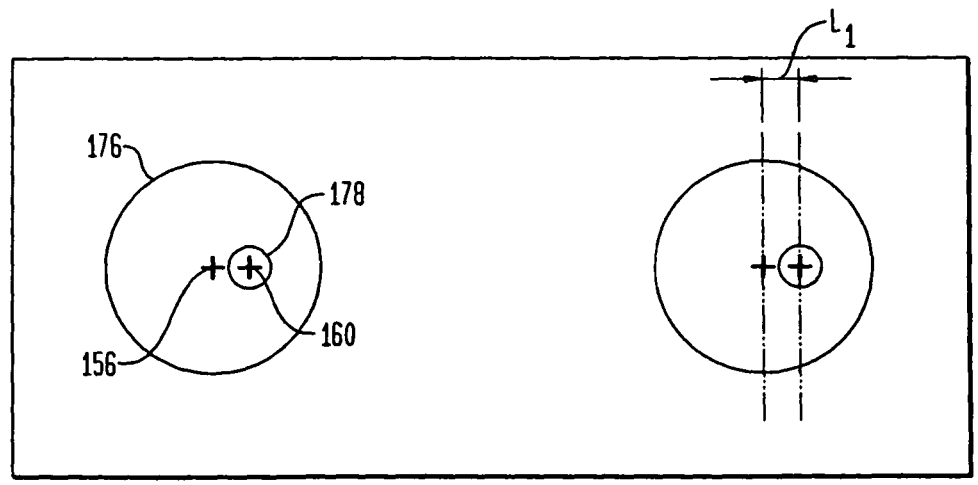

FIGS. 6A and 6B show a microelectronic assembly that is assembled in a manner substantially similar to the package described above in FIGS. 1-5B. The microelectronic assembly includes flexible substrate 136 having conductive posts 146 extending from a bottom surface 140 in a direction Z. The conductive post 146 has a first body 176 and a second body 178 formed atop the first body 176. The first body 176 has a base 154 defining a centroid 156. The second body 178 has a contact surface 148 defining a centroid 160. The centroid 160 at the contact surface 148 of second body 178 is offset from the base centroid 156 of the first body 176 by a horizontal distance $L_1$. The contact surface 148 of second body 178 defines the upper extremity of the conductive post 146. During a testing operation, when the conductive posts 146 are electrically interconnected with opposing contact pads on a test board (not shown), the upper extremity 148 is preferably the first point of the conductive post 146 to engage the contact pads. Due to the centroid 160 being offset from base centroid 156, the base 154 of the conductive posts 146 will tend to rotate about base centroid 156 to provide a wipe mechanism for the device. In certain embodiments, the second body 178 may be as large or larger than the first body 176.

Figure 7A:
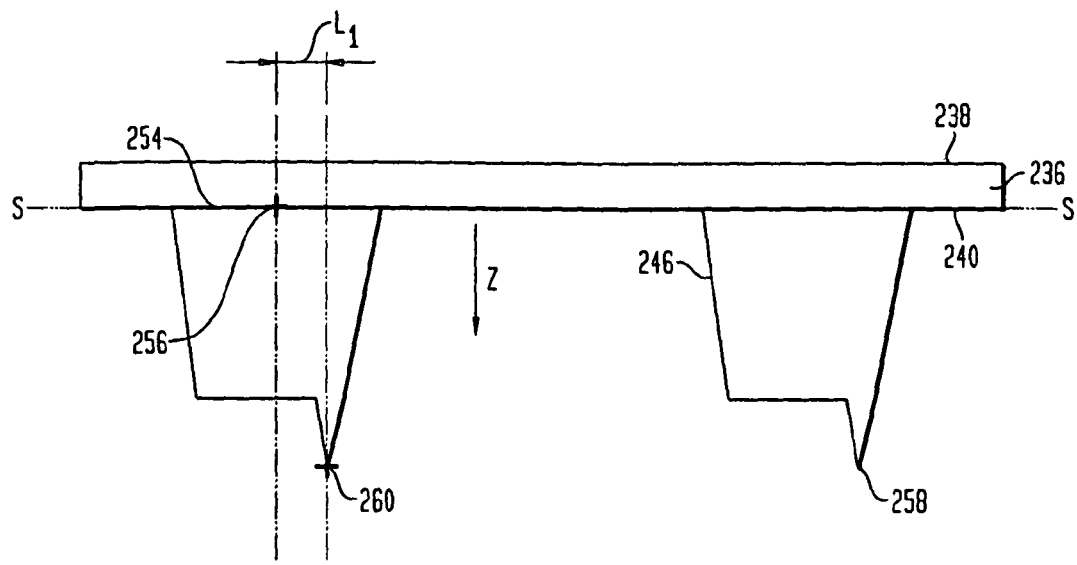
FIGS. 7A and 7B show a microelectronic package, in accordance with still other preferred embodiments of the present invention.
Figure 7B:
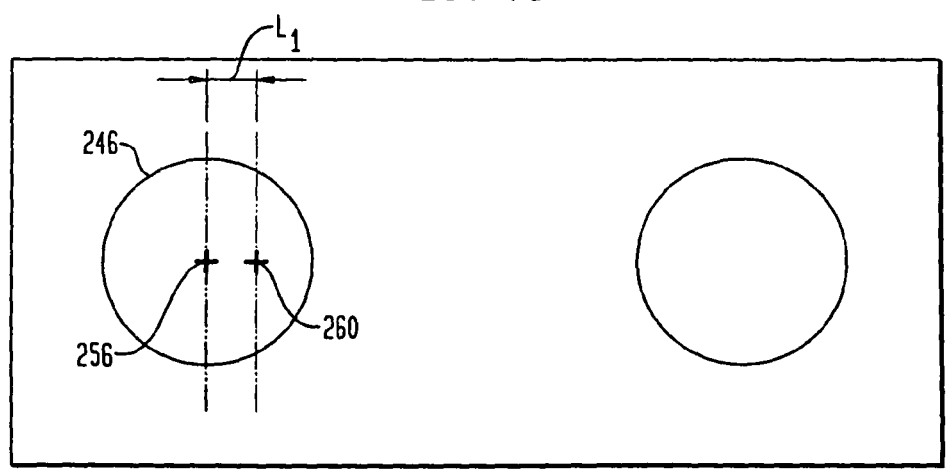

A microelectronic package according to another embodiment of the present invention (FIGS. 7A and 7B) includes flexible substrate 236 having top surface 238 and bottom surface 240. The package includes conductive posts 246 physically connected to the flexible substrate 236 and projecting from the bottom surface of flexible substrate 236 in a upward direction designated Z which is substantially perpendicular to a plane S defined by bottom surface 240 of flexible substrate 236. Each conductive post 246 has a base 254 defining a base centroid 256 and an upper extremity 258 defining an upper extremity centroid 260. In this embodiment, the post has a sharp point at its upper extremity. Here again, the centroid 260 of the upper extremity 258 is offset in a horizontal direction $L_1$ from the centroid 256 of the base 254. The horizontal offset direction $L_1$ extends in a direction transverse to the upward direction Z of the conductive posts 246. When the conductive posts 246 abut against opposing contact pads of a circuit board, the extremity 258 is designed to engage the contact pad first. Here again, the offset between the extremity 258 and the centroid of the base will cause the post to rotate about the base centroid to provide a wiping action. The sharp point increases the unit contact pressure and provides metal-to-metal contact. For example, the sharp point tends to cut through oxide layers or other contaminants.

Figure 8A:
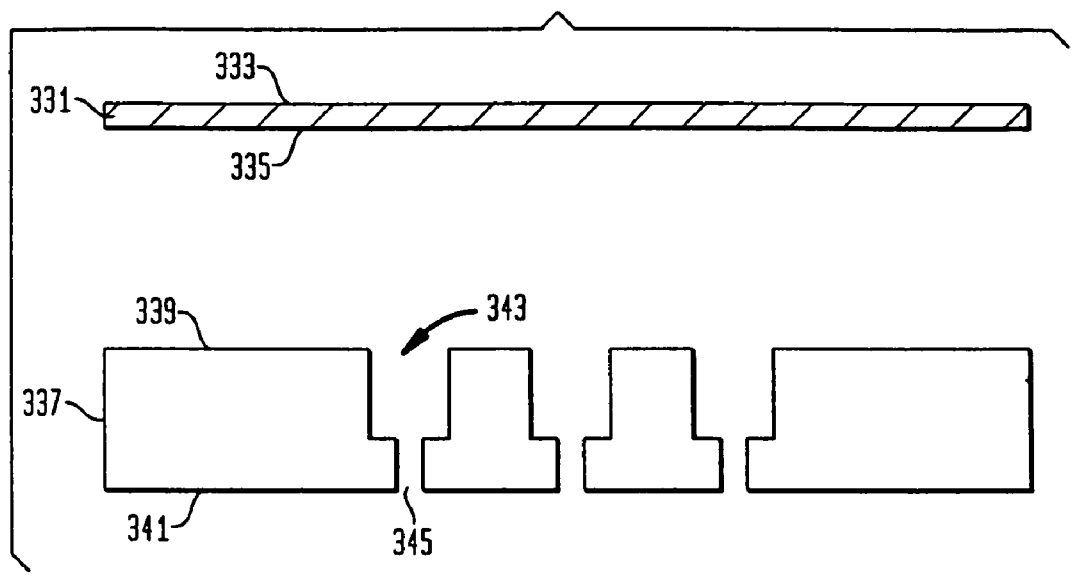
FIGS. 8A-8E show a method of making conductive terminals for a microelectronic package, in accordance with still further preferred embodiments of the present invention.

In a method of forming posts according to a further embodiment of the present invention, a blank 331 (FIG. 8A) of a conductive material such as copper has a top surface 333 and a bottom surface 335 remote therefrom. The blank 331 is associated with a mold 337 having a top surface 339 and a bottom surface 341. The mold 337 includes one or more depressions 343 formed therein and vent holes 345 extending between a lower region of depressions 343 and bottom surface 341 of mold 337.

Figure 8B:
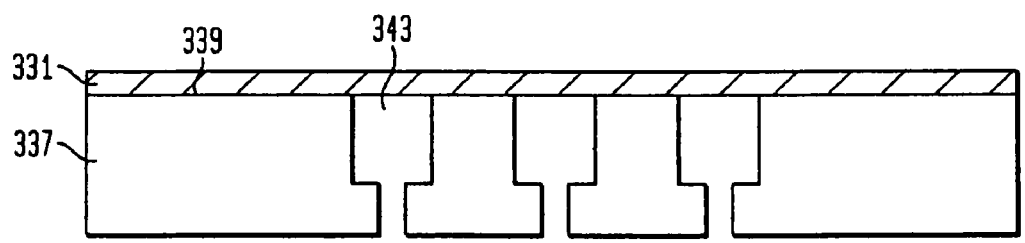

Referring to FIG. 8B, blank 331 is positioned over top surface 339 of mold 337 so that the blank 331 covers the depressions 343.

Figure 8C:
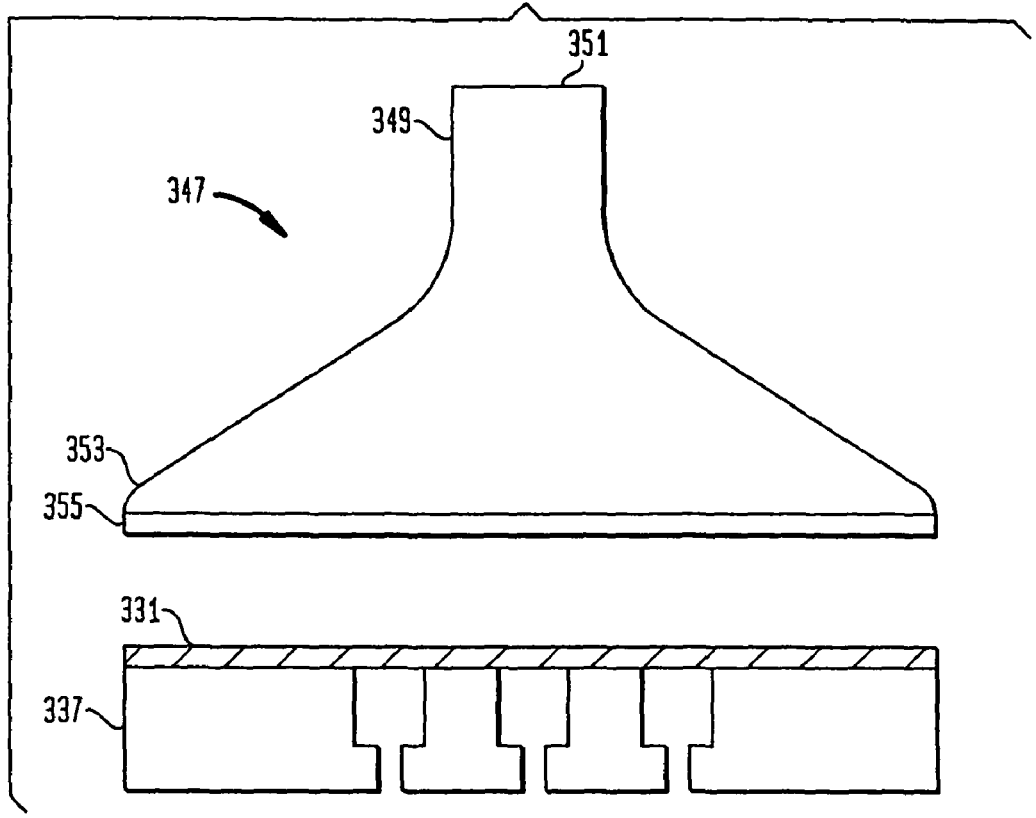
Figure 8D:
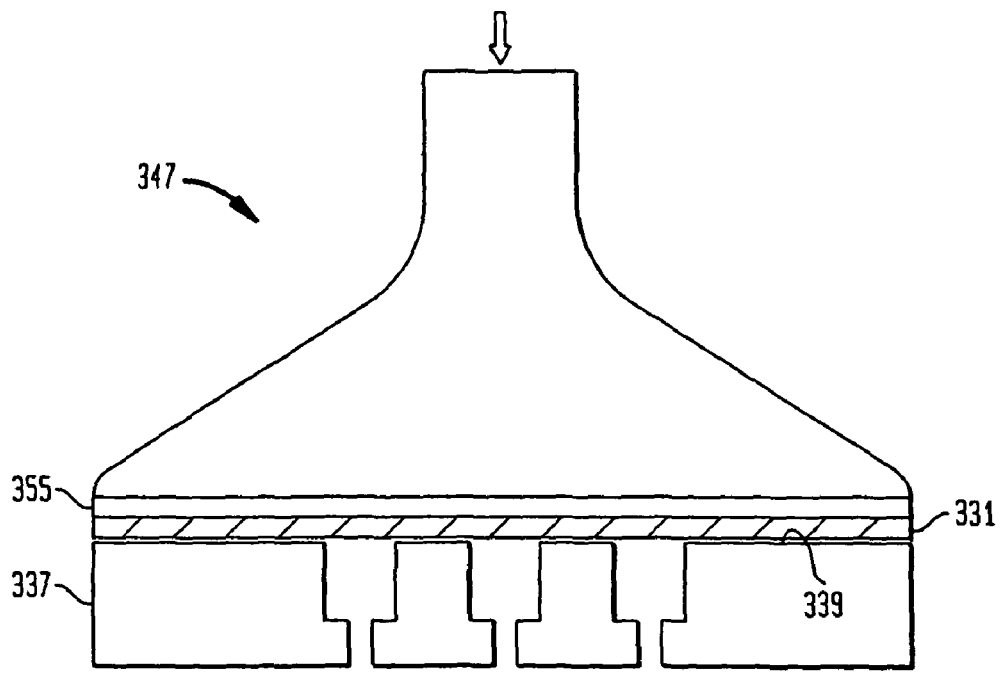

Referring to FIG. 8C, a pressure chamber 347 is positioned over the blank 331. The pressure chamber 347 includes an upper portion 349 having a fluid inlet 351 and a lower end 353 including an airtight sealing gasket 355. The pressure chamber 347 is preferably positioned over the mold 337 so that the sealing gasket 355 is aligned with the blank 331 positioned atop the mold. Referring to FIG. 8D, the pressure chamber 347 is preferably lowered so as to clamp the blank 331 between the airtight sealing gasket 355 and the top surface 339 of mold 337.

Figure 8E:
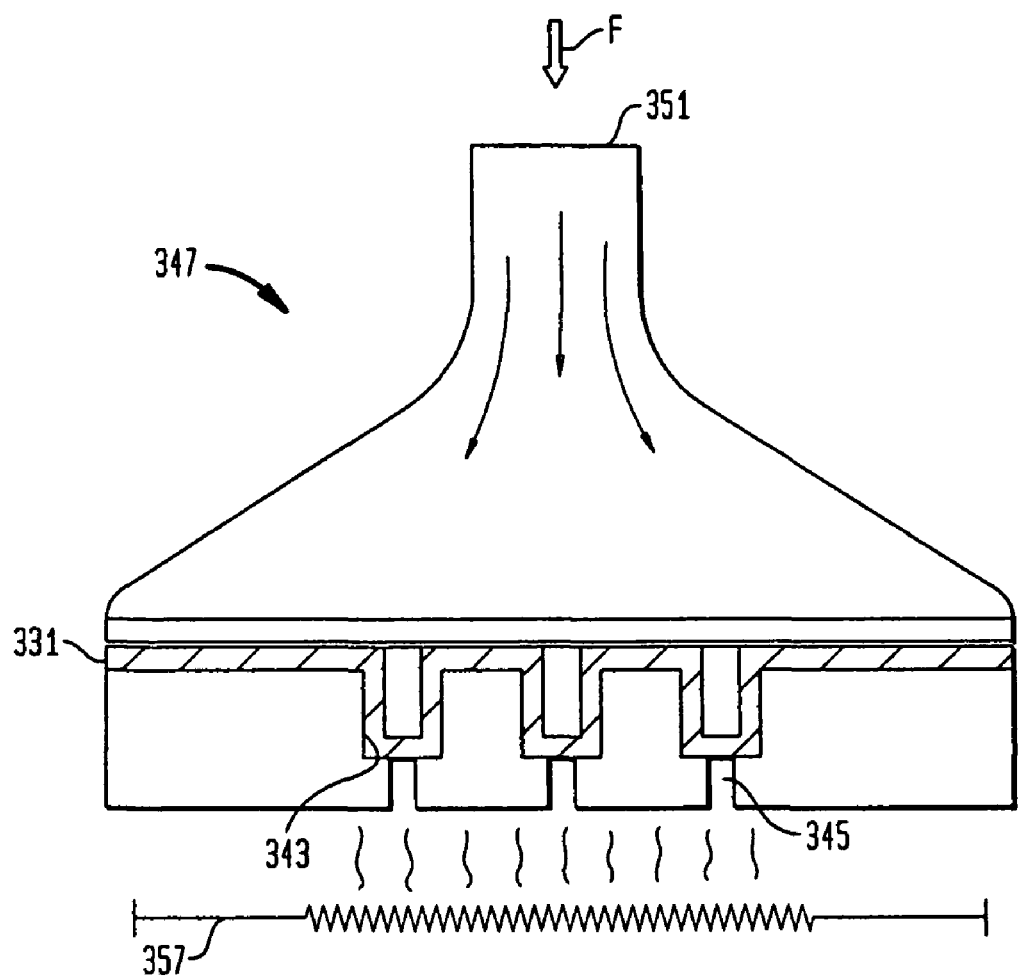

Referring to FIG. 8E, a fluid F, such as a high-pressure liquid, is introduced through inlet 351 of the pressure chamber 347. The pressurized fluid deforms the blank 331 so that certain regions of the blank conform to the shape of the depressions 343. During the deforming process, the vent holes 345 serve to prevent air entrapment and/or provide for pressure equalization. The vent holes 345 may also be used to perform an optical inspection of the deformation of the blank 331. The assembly may also include a heater (not shown) such as an infrared heater to heat the blank 331 so as to assist in the deformation of the blank. Although the present invention is not limited by any theory or operation, it is believed that heating the blank will make the blank material more ductile. Thus, the heating may create even larger vertical deformation of the blank 331 than would be possible without using heat.

Figure 9A:
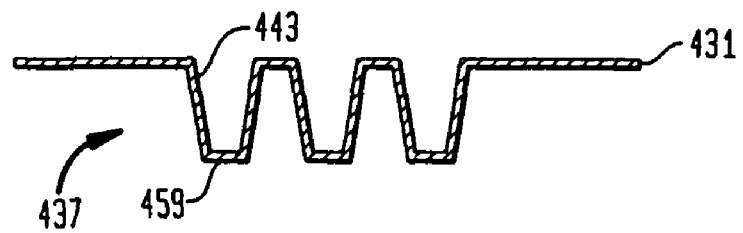
FIGS. 9A and 9B show a method of making conductive terminals for a microelectronic package, in accordance with other preferred embodiments of the present invention.
Figure 9B:
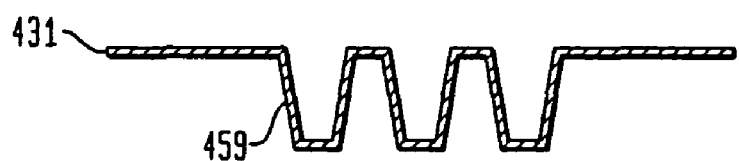

Referring to FIG. 9A, a copper sheet 431 is positioned atop a mold 437 having depressions 443 formed therein. The copper sheet 431 is treated as described above in FIGS. 8A-8C to form conductive posts 459. The conductive posts 459 have the shape of the depressions 443 of the mold 437. Referring to FIG. 9B, the copper sheet 431 with conductive posts 459 integrally formed therewith, is removed from the mold. The copper sheet 431 may then be processed, such as by etching, to remove portions of the sheet and to form conductive traces electrically interconnected with one or more of the conductive posts 459. Before or after forming the traces, the copper unit may be assembled with a flexible substrate, such as a polyimide film. The subassembly may then be assembled with a microelectronic element such as a semiconductor chip, whereby the conductive posts 459 are electrically interconnected with the microelectronic element.

Figure 10A:
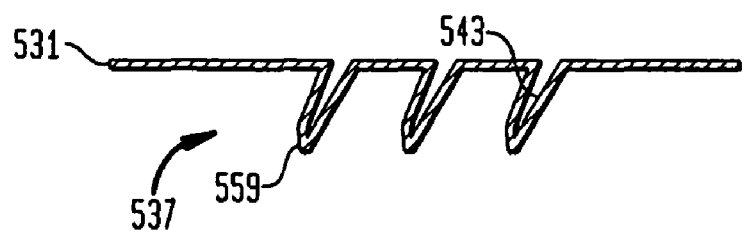
FIGS. 10A and 10B show a method of making conductive terminals for a microelectronic package, in accordance with still other preferred embodiments of the present invention.
Figure 10B:
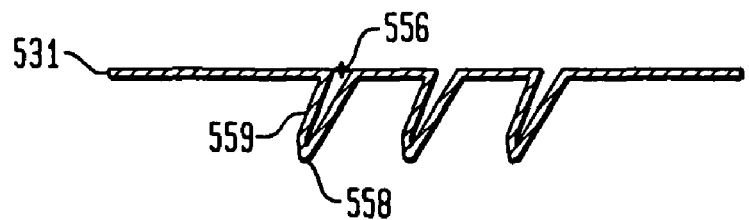

The shape of the conductive posts may be modified by changing the shape of the depressions in the mold. The shape of the conductive posts may also be modified depending upon the particular requirements of the package to which the posts will be assembled, for example, as shown in FIGS. 10A and 10B. Referring to FIG. 10A, a conductive foil 531 is positioned atop mold 537 so that the foil overlies depressions 543 formed in the mold. The process described above in FIGS. 8A-8E is used to deform the foil 531 and form conductive posts 559 that take the shape of depressions 543 of mold 537. Referring to FIG. 10B, the foil 531 with conductive posts 559 formed thereon is then removed from the mold. The posts 559 are inclined relative to the plane of the sheet, so that the upper extremity 558 of each post is offset from the centroid 556 of the base of that post.

Figure 11:
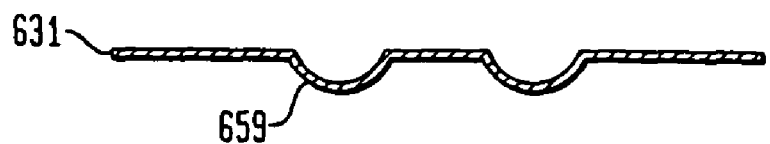
FIG. 11 shows a conductive sheet having terminals formed thereon, in accordance with another preferred embodiment of the present invention.
Figure 12:
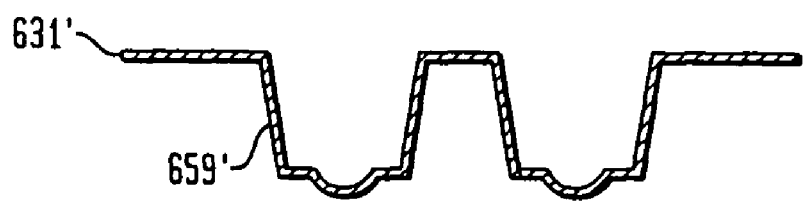
FIG. 12 shows a conductive sheet having terminals formed thereon, in accordance with yet another preferred embodiment of the present invention.
Figure 13:
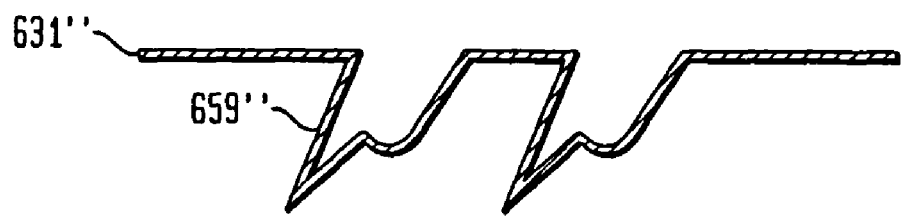
FIG. 13 shows a conductive sheet having conductive terminals formed thereon, in accordance with other preferred embodiments of the present invention.
Figure 14:
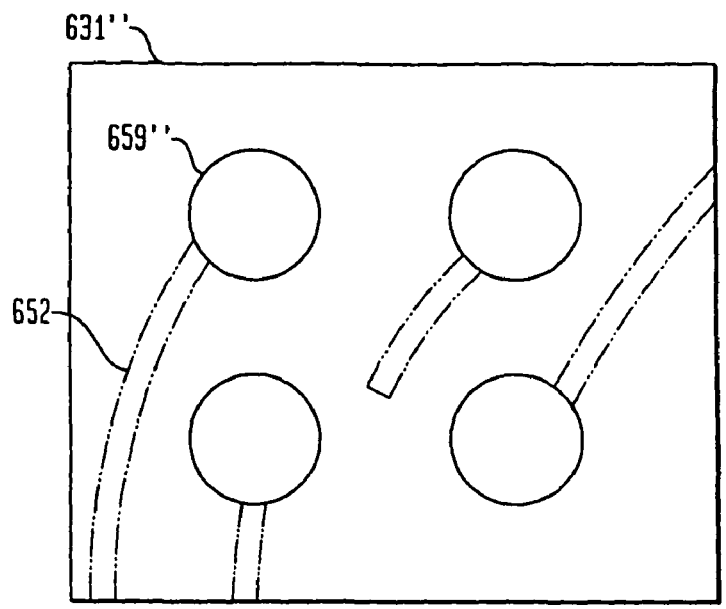
FIG. 14 shows a top plan view of the conductive sheet and terminals of FIG. 13.
Figure 15:
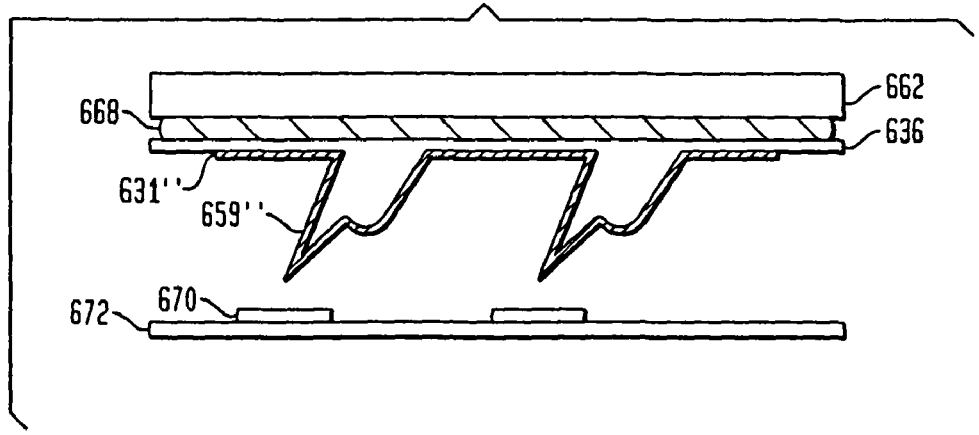
FIG. 15 shows the conductive sheet and terminals of FIG. 13 being assembled with a microelectronic element.

The methods described above in FIGS. 8A-10B can be used to form the conductive posts 659, 659' and 659" shown in respective FIGS. 11-13. These are merely exemplary of the shapes which can be formed. Referring to FIG. 14, in certain preferred embodiments, the conductive foil 631" is treated to form conductive traces 652 electrically interconnected with the conductive posts 659". The conductive traces may be formed by employing additive techniques such as deposition or lamination or removing techniques such as etching. Referring to FIG. 15, the conductive foil 631" and conductive posts 649" may then be assembled with a flexible substrate 636 such as a polyimide film, a compliant layer 668 and a microelectronic element 62 such as a semiconductor chip. The assembly may then be tested by juxtaposing the conductive posts 659" with contacts 670 on a test board 672 and engaging the contact pads 670 with the conductive posts 659".

Although not limited by any particular theory of operation, it is believed that using a pressurized fluid, commonly referred to as a hydroforming process, to deform a conductive blank enables the formation of conductive terminals or posts having unique and/or complex shapes. Hydroforming is significantly more flexible than using punch tools to shape conductive posts. As a result, conductive posts formed using the hydroforming steps of the present invention may have complex shapes and may be formed in large volumes at relatively low cost.

Figure 16A:
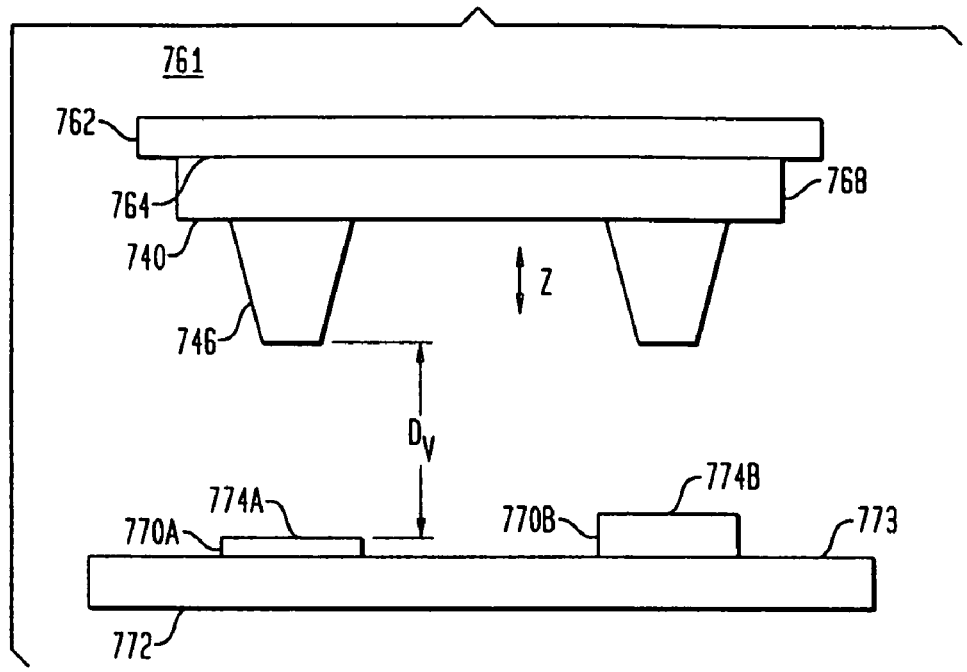
FIGS. 16A-16D show a microelectronic package having a plastically deformable component, in accordance with other preferred embodiments of the present invention.

Referring to FIG. 16A, a microelectronic package 761 includes a microelectronic element 762 having a contact-bearing face 764 and a mounting structure 768 assembled over the contact-bearing face 764 of the microelectronic element. The mounting structure 768 may include a flexible substrate such as a flexible film and a compliant support layer beneath the film, or may include only a support layer and the conductive element used to connect terminals 741 to microelectronic element 762. The microelectronic package also preferably includes conductive terminals or posts 746 provided on the mounting structure 768. The mounting structure has a plastically deformable material incorporated therein so that the posts 746 have compliancy along the axis designated Z, (FIG. 16A) orthogonal to a plane defined by a bottom surface 740 of mounting structure 768.

Here again, the microelectronic package 761 is tested by juxtaposing the conductive posts 746A, 746B with contacts 770A and 770B of a circuit board 772. The circuit board 772 has a top surface 773 at which contact pads 770A and 770B are exposed. A first contact pad 770A has a top surface 774A that defines a plane that is different height than a top surface 774B of another contact pad. Such non-planarity can arise from causes such as warpage of the test substrate 772 itself and unequal thicknesses of contact pads 770. Also, although not shown in FIG. 16A, the tips of the posts 746 may not be precisely coplanar with one another, due to factors such as non-planarity of the surface of the microelectronic device; warpage of the moving structure and unequal heights of the posts themselves. Also, the package may be tilted slightly with respect to the test substrate. For these and other reasons, the vertical distances Dv between the tips of the posts and the contact pads may be unequal.

Figure 16B:
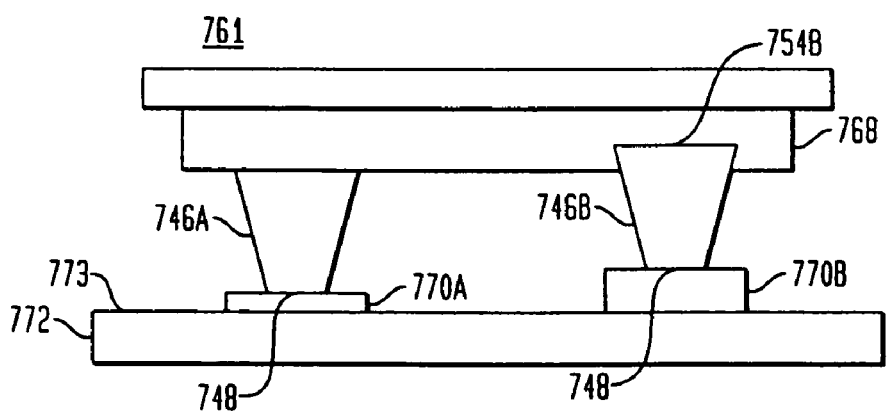

Referring to FIG. 16B, when microelectronic package 761 is tested, the conductive posts 746 are advanced toward the opposing contact pads 770 of test board 772. As shown in FIG. 16B, the base 754B of second conductive post 746B is able to move into the plastically deformable mounting structure 768. Even though the first conductive post 746A may also move into the deformable mounting structure, such movement is not necessary when forming an electrical interconnection because of the height difference between contact pads 770A and 770B. Although not limited by any particular theory of operation, it is believed that providing a microelectronic package having a plastically deformable mounting structure enables the conductive posts of the package to move so as to accommodate for opposing contact pads that are non-planar.

In this embodiment as well, while the posts are engaged with the contact pads, the package is subjected to electrical testing by passing power, signals and ground potential through the engaged posts and contact pads.

Many materials can deform through a substantial range of plastic deformation, larger than the range of elastic deformation. Preferably, the mounting structure is susceptible to plastic deformation under relatively small forces, which are less than those forces required to damage the other elements of the package and test board. The relatively large range of plastic deformation allows for substantial movement of the posts during testing. Stated another way, a plastically-deformable mounting structure can provide a greater range of movement of the posts than a structure of comparable dimensions which is not susceptible to plastic deformation under the range of forces encountered during testing. As used in this disclosure, the term "plastic deformation" means a deformation which does not spontaneously reverse itself within a short time, such as a few minutes or seconds, after removal of the applied loads. Some plastically deformable materials have a shape memory, and can return to their original configuration upon heating or cooling after plastic deformation. Other plastically deformable materials, such as certain polymeric foams, tend to recover their original shape after prolonged storage. If these materials are employed, the package with a plastically-deformed mounting structure can be subjected to heating, cooling or prolonged storage after testing so as to return the posts or other terminals to their original configuration.

Figure 16C:
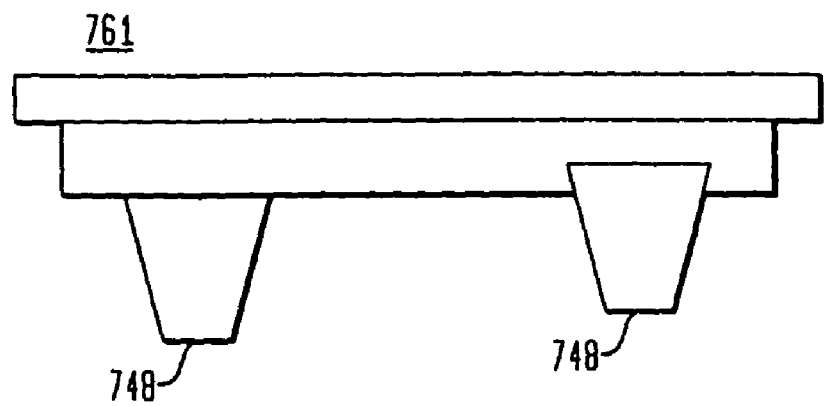
Figure 16D:
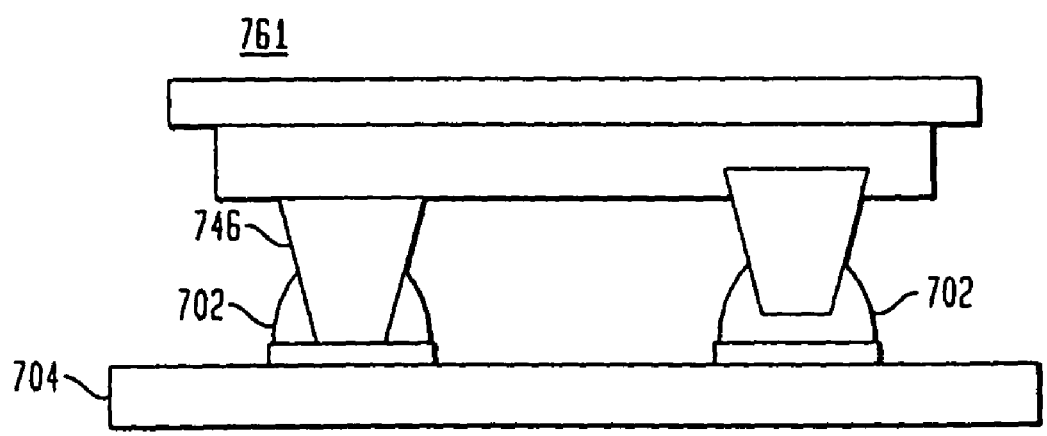

However, in many cases, the plastically deformed mounting structure cannot recover its original configuration, but instead is permanently deformed during the testing operation. As shown in FIG. 16C, the tips or contact surfaces 748 of the posts have been permanently displaced to a non-planar configuration corresponding to the configuration of the contact pad surfaces. However, this does not pose a serious drawback. After testing, referring to FIG. 16D, the package can be permanently mounted to a circuit board 704 using solder or other bonding material 702 to connect the posts 746 or other terminals to the contacts. The bonding material 702 compensates for the non-planarity of the post tips. In a further variant, the package can be forced into engagement with a circuit board during the permanent mounting operation, thereby deforming the mounting structure again so as to bring the post tips or other contact surfaces of the terminals into conformity with the contact pads 706 of the circuit board. In still another variant, the package can be abutted against a known planar surface after testing so as to bring the post tips into planarity. In a reverse arrangement, the test board used during the testing operation is a planar structure, having all of its contact pads coplanar. The plastic deformation of the mounting structure during testing in this variant will make the post tips more nearly coplanar with one another, and hence compensates for imperfections in the package.

Figure 17A:
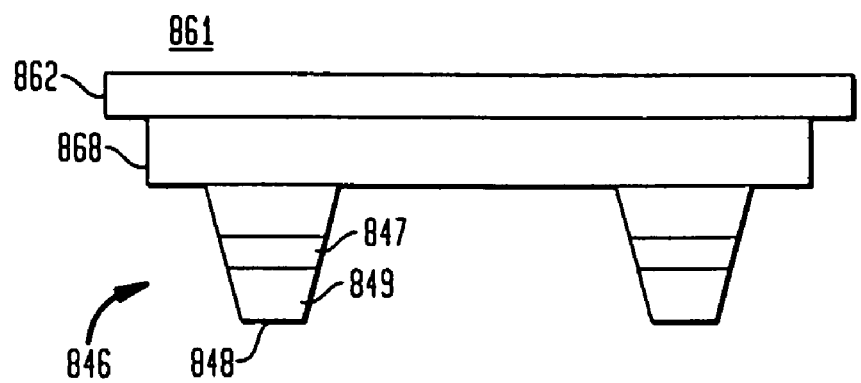
FIGS. 17A and 17B show a microelectronic package having plastically deformable terminals, in accordance with yet further preferred embodiments of the present invention.

Referring to FIG. 17A, a microelectronic package 861 includes a microelectronic element 862 having contacts (not shown), a mounting structure 868 associated with the microelectronic element 862 and a plurality of conductive terminals 846 carried on the mounting structure. Each conductive terminal 846 has an exposed contact surface 848 at a tip end thereof. Each of the conductive terminals 846 is plastically deformable and includes a weaker region 847 and a stronger region 849. The weaker region 847 is preferably able to more readily plastically deform than the stronger region of the terminal. Thus, the stronger material 849 desirably has a lower yield strength than the first or weaker material. The first material in the weaker region 847 may include conductive materials such as annealed tin, annealed lead, annealed gold, and shape memory alloys. The first material may also be a non-conductive material, such as expanded polypropylene foam or other polymeric materials. Where the first material is a nonconductive material, the post may include a very weak conductive element extending across the non-conductive material so as to maintain electrical continuity.

Figure 17B:
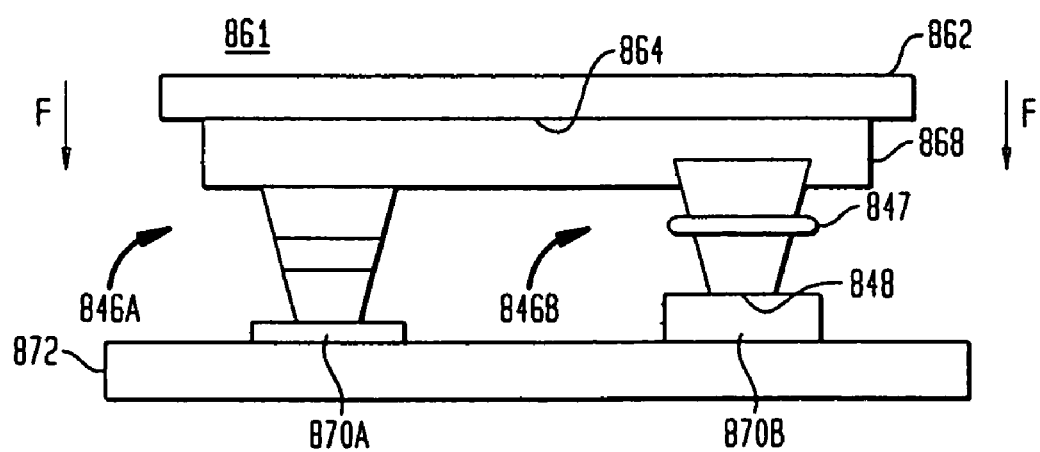

Referring to FIG. 17B, in operation the microelectronic package 861 is tested by aligning the conductive posts 846 with contact pads 870 on a test board 872. As shown in FIG. 17B, the respective contact pads 870A and 870B of test board 872 do not have top surfaces that lie in a common plane. As a result, the conductive posts 846 will have to accommodate such non-planarity if a reliable electrical interconnection is to be formed. Due to the plastically deformable material 847 in the conductive posts 846, the exposed contact surface 848 of second conductive posts 846 is displaced relative to the contact-bearing face 864 of microelectronic element 862. As a result, the exposed contact surfaces of conductive posts are able to form reliable interconnections with the opposing contact pads. As explained above, the plastically deformable materials can provide a greater range of motion than could be obtained using elastic deformation. Here again, the testing step can result in a permanent change in the configuration of the post tips.

Figure 18A:
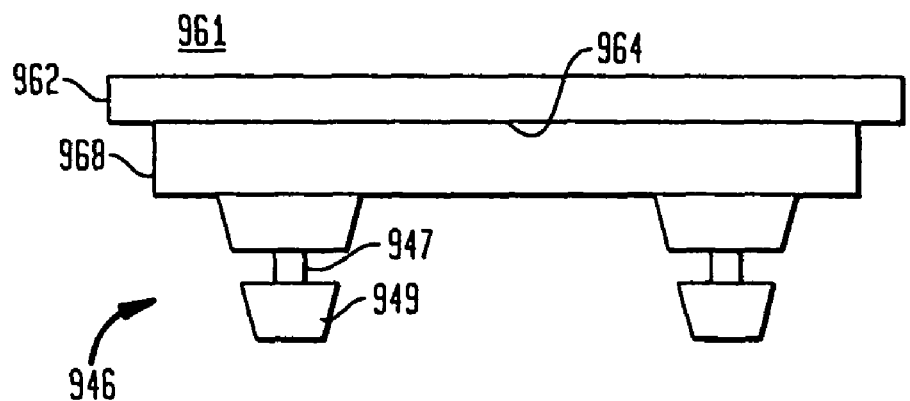
FIGS. 18A and 18B show a microelectronic package having plastically deformable terminals, in accordance with still other preferred embodiments of the present invention.
Figure 18B:
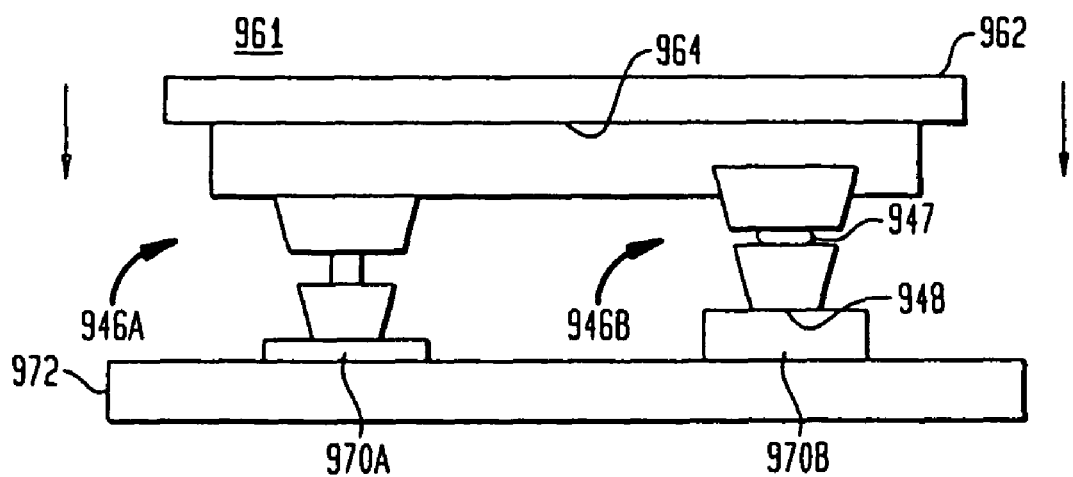

FIGS. 18A and 18B show a microelectronic package having plastically deformable conductive posts, in accordance with other embodiments of the present invention. Referring to FIG. 18A, the microelectronic package 961 includes a microelectronic element 962 having a contact-bearing face 964, a mounting structure secured over the contact-bearing face 964 of microelectronic element 962 and conductive posts 946 projecting from the mounting structure 968. Each conductive post 946 has a stronger region 949 and a weaker region 947. In the particular embodiment shown in FIG. 18A, the weaker region has a smaller cross-sectional area than the stronger region 949 of the post 946. The material in the weaker region may be the same as the material in the stronger region. Alternatively, the material in the weaker region may have different properties than the material in the stronger region. Referring to FIG. 18B, when the microelectronic package 961 is abutted against a test board 972, the plastically deformable conductive posts 946 are able to accommodate non-planar contact pads 970. Due to second contact pad 970b having a greater height than first contact pad 970a, the second plastically deformable conductive posts 946b deforms at weaker region 947 so that its exposed contact surface 948 may be displaced relative to contact-bearing face 964 of microelectronic element 962. In contrast, the first conductive post 946A does not undergo plastic deformation as such deformation is not necessary to form a reliable electrical interconnection between its exposed contact surface and contact pad 970a.

Figure 19A:
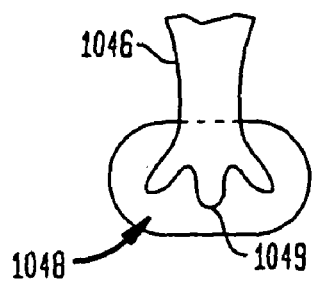
FIGS. 19A and 19B show conductive terminals having plastically deformable tip ends, in accordance with certain preferred embodiments of the present invention.
Figure 19B:
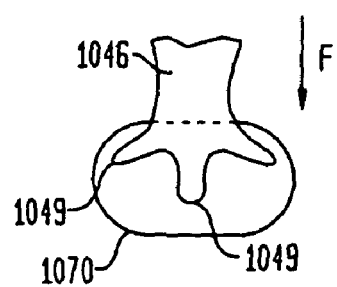

FIGS. 19A and 19B show conductive posts having configurations in accordance with a further embodiment of the present invention. Referring to FIG. 19A, the conductive post 1046 has a tip end 1048 including deformable extremities 1049. The particular structure may be described as a conductive post or terminal having a fleur de lis structure similar to the deformable contact shown in commonly assigned U.S. Pat. No. 6,239,386, the disclosure of which is hereby incorporated by reference herein.

Referring to FIG. 19B, when the conductive post 1046 is juxtaposed with a contact pad 1070 of a test board (not shown), and a downward force F is applied through the conductive post 1046, the extremities 1049 plastically deform outwardly so as to provide a wiping action between the extremities 1049 and the contact pad 1070. Such wiping action promotes the formation of a reliable electrical interconnection between the conductive post 1046 and the contact pad 1070. The extremities may be made of materials that are able to deform plastically and/or elastically.

Figure 20A:
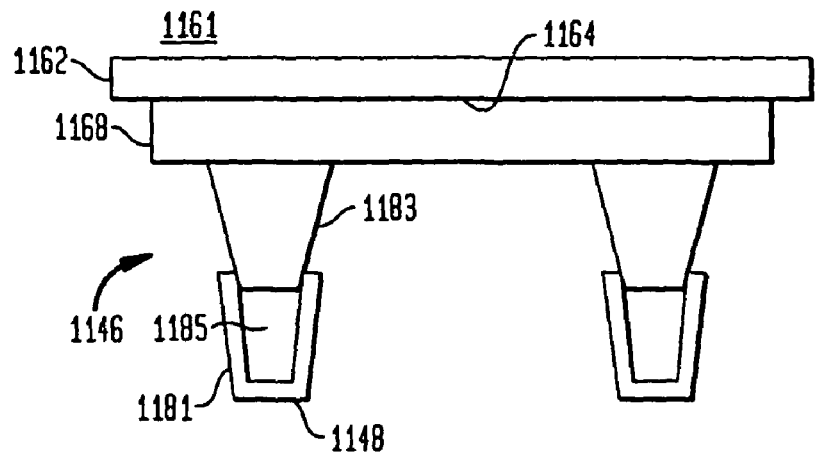
FIGS. 20A and 20B show a microelectronic package having plastically deformable conductive terminals, in accordance with still further preferred embodiments of the present invention.

Referring to FIG. 20A, a microelectronic package 1161, in accordance with yet another embodiment of the present invention includes a microelectronic element 1162 having a contact-bearing face 1164, a mounting structure 1168 provided over the contact-bearing face 1164 and conductive posts 1146 projecting from the mounting structure 1168. Each conductive post 1146 includes two or more elements. In the particular embodiment shown, the two or more elements include a first element 1181 having an exposed contact surface 1148 secured over a second element 1138 carried on the mounting structure 1168. The first element 1181 preferably has an opening 1185 and the second element 1183 is received in the opening. The first element 1181 preferably forms a friction fit with the second element 1183.

Figure 20B:
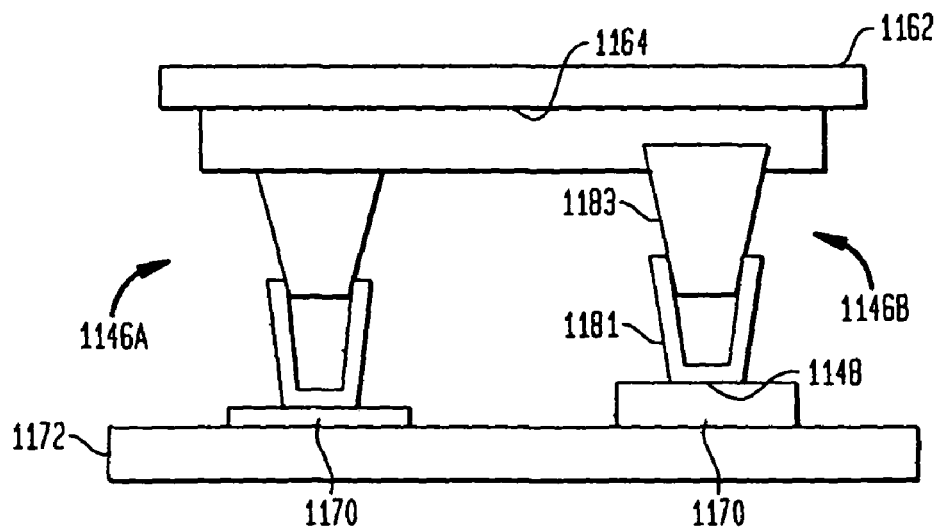

Referring to FIG. 20B, when the microelectronic package 1161 is juxtaposed with a test board 1172 having non-planar contact pads 1170, the plastically deformable conductive posts 1146 are able to plastically deform so as to accommodate the non-planar opposing surface. As shown in FIG. 20B, the first element 1181 slides over second element 1183 to accommodate for the height difference between the contact pads 1170. Thus, the exposed contact surface 1148 of second conductive posts 1146b is displaced relative to the contact-bearing face 1164 of microelectronic element 1162.

In certain preferred embodiments of the present invention, a particle coating such as that disclosed in U.S. Pat. Nos. 4,804,132 and 5,083,697, the disclosures of which are incorporated by reference herein, may be provided on one or more electrically conductive parts of a microelectronic package for enhancing the formation of electrical interconnections between microelectronic elements and for facilitating testing of microelectronic packages. The particle coating is preferably provided over conductive parts such as conductive terminals or the tip ends of conductive posts. In one particularly preferred embodiment, the particle coating is a metalized diamond crystal coating that is selectively electroplated onto the conductive parts of a microelectronic element using standard photoresist techniques. In operation, a conductive part with the diamond crystal coating may be pressed onto an opposing contact pad for piercing the oxidation layer present at the outer surface of the contact pad. The diamond crystal coating facilitates the formation of reliable electrical interconnections through penetration of oxide layers, in addition to traditional wiping action.

As discussed in greater detail in the co-pending, commonly assigned U.S. Provisional Application Ser. No. 60/533,210, filed on Dec. 30, 2003, entitled "MICROELECTRONIC PACKAGES AND METHODS THEREFOR," the disclosure of which is hereby incorporated herein by reference, the support structure may include a plurality of spaced apart support elements and may also include a flexible sheet overlying the support elements. The conductive posts may be offset in horizontal directions from the support elements. The offset between the posts and the support elements allows the posts, and particular the bases of the posts, to move independently of one another relative to a microelectronic element. Microelectronic packages having conductive terminals or posts that are able to move independently of one another is also disclosed in greater detail in co-pending, commonly assigned U.S. Provisional Application Ser. No. 60/533,437, filed on Dec. 30, 2003, entitled "MICRO PIN GRID WITH PIN MOTION ISOLATION," the disclosure of which is hereby incorporated herein by reference.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic package comprising:
a microelectronic element having a face and a plurality of contacts;
a mounting structure including a dielectric substrate assembled with said microelectronic element, said mounting structure including a compliant layer overlying said face; and
a plurality of posts physically connected with said dielectric substrate, said plurality of posts consisting essentially of copper and fully separated from said face of said microelectronic element by at least said compliant layer, said plurality of posts having upper extremities projecting in an upward direction away from said face of said microelectronic element to a height above said mounting structure such that said upper extremities of said plurality of posts are available for engagement with corresponding contact pads of a circuit board when juxtaposed with said contact pads,
wherein said mounting structure further includes conductive traces physically connected with said dielectric substrate, said conductive posts being electrically connected with said contacts of said microelectronic element through said conductive traces,
at least one of said conductive posts being an offset post, the base of each said offset post defining a centroid, and the upper extremity of each said offset post defining a centroid, the centroid of the upper extremity being offset from the centroid of the base in a horizontal offset direction transverse to said upward direction.

2. The microelectronic package as claimed in claim 1, wherein said mounting structure is adapted to permit tilting of each said offset post about a horizontal axis.

3. The microelectronic package as claimed in claim 1, wherein said dielectric substrate is flexible.

4. The microelectronic package as claimed in claim 3, wherein said flexible substrate is a generally sheet-like substrate extending substantially in a horizontal plane, said substrate having a top surface and a bottom surface, said posts projecting beyond said top surface in said upward direction.

5. The microelectronic package as claimed in claim 4, wherein said substrate includes a plurality of gaps extending through the substrate and defining a plurality of regions, different ones of said posts being disposed on different ones of said regions.

6. The microelectronic package as claimed in claim 5, wherein only one of said posts is disposed on each of said regions.

7. The microelectronic package as claimed in claim 4, further comprising a plurality of support elements spaced apart from one another and disposed between said flexible substrate and said microelectronic element, wherein bases of said posts are spaced horizontally from said support elements.

8. The microelectronic package as claimed in claim 3, wherein said conductive traces are formed on said flexible substrate.

9. The microelectronic package of claim 3, wherein said compliant layer separates said flexible substrate from said face of said microelectronic element.

10. The microelectronic package as claimed in claim 1, wherein said contacts are exposed at said face of said microelectronic element.

11. The microelectronic package as claimed in claim 1, wherein said face is a first face of said microelectronic element, said microelectronic element further including a second face remote from said first face, wherein said contacts are exposed at said second face.

12. The microelectronic package of claim 1, wherein each of the plurality of posts comprises a base capable of rotating, so as to allow said posts to move horizontally.

13. The microelectronic package of claim 1, wherein said compliant layer further comprises a bottom surface adjacent said face of said microelectronic element, a top surface remote from said bottom surface, and an edge surface extending between said top and bottom surfaces,
wherein said traces extend along said edge surface and said top surface of said compliant layer to said posts.

14. The microelectronic package of claim 1, wherein said compliant layer further comprises a bottom surface adjacent said microelectronic element and a top surface remote from said bottom surface,
wherein said conductive traces overlie said compliant layer and have a long dimension in a direction between said contacts of the microelectronic element and said posts.

15. The microelectronic package of claim 1, further comprising a metal layer formed over an outer surface of the posts.

16. The microelectronic package of claim 15, wherein the metal layer includes a layer of gold.

17. A microelectronic package comprising:
a microelectronic element having a face and a plurality of contacts;
a mounting structure including a dielectric substrate assembled with said microelectronic element, said mounting structure including a compliant layer overlying said face; and
a plurality of posts physically connected with said dielectric substrate, said plurality of posts consisting essentially of copper and fully separated from said face of said microelectronic element by at least said compliant layer, said posts projecting upwardly away from said mounting structure, each said post having a base supported above said face of said microelectronic element by said mounting structure and having an upper extremity remote from the microelectronic element, at least some of said posts having sharp features at or near their upper extremities such that said upper extremities of said plurality of posts are available for engagement with corresponding contact pads of a circuit board when juxtaposed with said contact pads,
wherein said mounting structure further includes conductive traces physically connected with said dielectric substrate, said conductive posts being electrically connected with said contacts of said microelectronic element through said conductive traces.

18. The microelectronic package as claimed in claim 17, wherein at least some of said posts have tip surfaces extending oblique to the upward directions of the posts, said oblique surfaces at least partially defining the sharp features.

19. The microelectronic package of claim 17, further comprising a metal layer formed over an outer surface of the posts.

20. The microelectronic package of claim 19, wherein the metal layer includes a layer of gold.

* * * * *